United States Patent
Raghavan et al.

(10) Patent No.: US 11,576,145 B2
(45) Date of Patent: Feb. 7, 2023

(54) COMBINING TECHNIQUES FOR MESSAGE FORWARDING IN WIRELESS COMMUNICATIONS

(71) Applicant: QUALCOMM Incorporated, San Diego, CA (US)

(72) Inventors: Vasanthan Raghavan, West Windsor Township, NJ (US); Jung Ho Ryu, Fort Lee, NJ (US); Junyi Li, Chester, NJ (US); Tianyang Bai, Somerville, NJ (US)

(73) Assignee: QUALCOMM Incorporated, San Diego, CA (US)

( * ) Notice: Subject to any disclaimer, the term of this patent is extended or adjusted under 35 U.S.C. 154(b) by 125 days.

(21) Appl. No.: 17/111,768

(22) Filed: Dec. 4, 2020

(65) Prior Publication Data
US 2021/0204245 A1 Jul. 1, 2021

Related U.S. Application Data

(60) Provisional application No. 62/956,173, filed on Dec. 31, 2019.

(51) Int. Cl.
*H04W 68/00* (2009.01)
*H04L 1/00* (2006.01)
(Continued)

(52) U.S. Cl.
CPC ........ *H04W 68/005* (2013.01); *H04L 1/0061* (2013.01); *H04L 27/364* (2013.01); *H04W 4/40* (2018.02); *H04W 8/24* (2013.01)

(58) Field of Classification Search
None
See application file for complete search history.

(56) References Cited

U.S. PATENT DOCUMENTS

| 2008/0107054 A1* | 5/2008 | Parts | H04L 1/1845 370/310 |
| 2009/0196332 A1* | 8/2009 | Miyatani | H04B 7/026 375/214 |

(Continued)

FOREIGN PATENT DOCUMENTS

| WO | WO-2009107925 A1 * | 9/2009 | ........ H04L 1/1829 |
| WO | WO-2010134188 A1 * | 11/2010 | ...... H04B 7/15557 |
| WO | WO-2021034966 | 2/2021 | |

OTHER PUBLICATIONS

Huawei et al., "Rel-17 Work Scope on NR Sidelink Enhancements for 5G V2X and Other Use Case", 3GPP Draft, 3GPP TSG RAN Meeting #84, RP-191011 Rel-17 Work Scope on NR Sidelink Enhancements for V2X and Other Use Case_Near Final, 3rd Generation Partnership Project (3GPP), Mobile Competence Centre, 650, Route Des Luciole, vol. TSG RAN, No. Newport Beach, USA, Jun. 3, 2019-Jun. 6, 2019 Jun. 2, 2019 (Jun. 2, 2019), XP051747224, 12 Pages, Retrieved from the Internet: URL:http://www.3gpp.org/ftp/Meetings%5F3GPP%5FSYNC/RAN/Docs/RP%2D191011%2Ezip [retrieved on Jun. 2, 2019], section 2.2.
(Continued)

*Primary Examiner* — Rebecca E Song
(74) *Attorney, Agent, or Firm* — Holland & Hart LLP

(57) ABSTRACT

Methods, systems, and devices for wireless communications are described that allow for a first user equipment (UE) to forward a transmission from a second UE to a base station. The forwarding techniques may include the first UE performing a decoding procedure on a message received from the second UE via a sidelink communications link. Based on the results of the decoding procedure, the first UE may select an amplify and forward (AF), decode and forward (DF), or a combination thereof to forward the message from the second UE to the base station. The base station may receive the forward messages and, in some cases, a message directly
(Continued)

from the second UE, and may determine decoding weights to use to jointly decode the two messages received at the base station.

30 Claims, 16 Drawing Sheets

(51) Int. Cl.
*H04W 4/40* (2018.01)
*H04L 27/36* (2006.01)
*H04W 8/24* (2009.01)

(56) References Cited

U.S. PATENT DOCUMENTS

| | | | |
|---|---|---|---|
| 2010/0035541 A1* | 2/2010 | Kim | H04B 7/2606 |
| | | | 455/9 |
| 2011/0092154 A1* | 4/2011 | Horiuchi | H04W 72/02 |
| | | | 455/7 |
| 2015/0016571 A1* | 1/2015 | McCoy | H04L 27/3863 |
| | | | 375/346 |
| 2018/0139016 A1* | 5/2018 | Moshfeghi | H04L 5/0032 |

OTHER PUBLICATIONS

International Search Report and Written Opinion—PCT/US2020/063658—ISA/EPO—May 14, 2021.

\* cited by examiner

COMBINING TECHNIQUES FOR MESSAGE FORWARDING IN WIRELESS COMMUNICATIONS

CROSS REFERENCE

The present Application for Patent claims the benefit of U.S. Provisional Patent Application No. 62/956,173 by RAGHAVAN et al., entitled "COMBINING TECHNIQUES FOR MESSAGE FORWARDING IN WIRELESS COMMUNICATIONS," filed Dec. 31, 2019, assigned to the assignee hereof, and expressly incorporated herein.

FIELD OF TECHNOLOGY

The following relates generally to wireless communications and more specifically to combining techniques for message forwarding in wireless communications.

BACKGROUND

Wireless communications systems are widely deployed to provide various types of communication content such as voice, video, packet data, messaging, broadcast, and so on. These systems may be capable of supporting communication with multiple users by sharing the available system resources (e.g., time, frequency, and power). Examples of such multiple-access systems include fourth generation (4G) systems such as Long Term Evolution (LTE) systems, LTE-Advanced (LTE-A) systems, or LTE-A Pro systems, and fifth generation (5G) systems which may be referred to as New Radio (NR) systems. These systems may employ technologies such as code division multiple access (CDMA), time division multiple access (TDMA), frequency division multiple access (FDMA), orthogonal FDMA (OFDMA), or discrete Fourier transform spread orthogonal frequency division multiplexing (DFT-S-OFDM). A wireless multiple-access communications system may include one or more base stations or one or more network access nodes, each simultaneously supporting communication for multiple communication devices, which may be otherwise known as user equipment (UE).

The wireless multiple-access communications system may further support millimeter wave (mmW), or frequency range 2 (FR2), cooperative transmissions. That is, a wireless communications system may utilize frequencies that are greater than 6 GHz to wirelessly communicate between the multiple wireless devices. In such cases, one or more UEs may act as a relay that may jointly transmit to a Next Generation Node B (gNB) using only one of an amplify and forward (AF) or a decode and forward (DF) transmission scheme. Such limitations may reduce the likelihood of successful reception of the forwarded message at the gNB.

SUMMARY

The described techniques relate to improved methods, systems, devices, and apparatuses that support combining techniques for message forwarding in wireless communications. Generally, the described techniques provide for a user equipment (UE) to utilize one or a combination of an amplify and forward (AF) or decode and forward (DF) transmission scheme to transmit one or more portions of a sidelink message received from a second UE to a base station. Factors including thermal constraints, link budgets, power availability, latency at the UEs and the next generation NodeB (gNB), and non-intermixed usage of the distinct transmission schemes may be considered to provide efficient data forwarding. Further, a UE may attempt to decode a message received from a sidelink UE and depending on whether the decoding is successful, the UE may select AF, DF, or some combination thereof, prior to forwarding to the base station.

A method of wireless communications at a first UE is described. The method may include receiving, via a sidelink communications link, a first message from a second UE for forwarding by the first UE to a base station, performing a decoding procedure on the first message, selecting, based on a result of the decoding procedure, between generating a second message including a re-encoded portion of the first message for forwarding to the base station or generating the second message including an amplified portion of the first message for forwarding to the base station, and transmitting the second message to the base station based on the selecting.

An apparatus for wireless communications at a first UE is described. The apparatus may include a processor, memory coupled with the processor, and instructions stored in the memory. The instructions may be executable by the processor to cause the apparatus to receive, via a sidelink communications link, a first message from a second UE for forwarding by the first UE to a base station, perform a decoding procedure on the first message, select, based on a result of the decoding procedure, between generating a second message including a re-encoded portion of the first message for forwarding to the base station or generating the second message including an amplified portion of the first message for forwarding to the base station, and transmit the second message to the base station based on the selecting.

Another apparatus for wireless communications at a first UE is described. The apparatus may include means for receiving, via a sidelink communications link, a first message from a second UE for forwarding by the first UE to a base station, performing a decoding procedure on the first message, selecting, based on a result of the decoding procedure, between generating a second message including a re-encoded portion of the first message for forwarding to the base station or generating the second message including an amplified portion of the first message for forwarding to the base station, and transmitting the second message to the base station based on the selecting.

A non-transitory computer-readable medium storing code for wireless communications at a first UE is described. The code may include instructions executable by a processor to receive, via a sidelink communications link, a first message from a second UE for forwarding by the first UE to a base station, perform a decoding procedure on the first message, select, based on a result of the decoding procedure, between generating a second message including a re-encoded portion of the first message for forwarding to the base station or generating the second message including an amplified portion of the first message for forwarding to the base station, and transmit the second message to the base station based on the selecting.

Some examples of the method, apparatuses, and non-transitory computer-readable medium described herein may further include operations, features, means, or instructions for encoding, based on a successful decoding procedure, a decoded portion of the first message before generating the second message.

Some examples of the method, apparatuses, and non-transitory computer-readable medium described herein may further include operations, features, means, or instructions for performing, as part of the decoding procedure, an error checking procedure on the first message, and determining the result of the decoding procedure based on a success or failure of the error checking procedure.

In some examples of the method, apparatuses, and non-transitory computer-readable medium described herein, the error checking procedure includes a cyclic redundancy check (CRC) procedure.

Some examples of the method, apparatuses, and non-transitory computer-readable medium described herein may further include operations, features, means, or instructions for amplifying, based on an unsuccessful decoding procedure, an undecoded portion of the first message before generating the second message.

In some examples of the method, apparatuses, and non-transitory computer-readable medium described herein, the second message includes a set of undecoded samples of the first message based on the unsuccessful decoding procedure.

Some examples of the method, apparatuses, and non-transitory computer-readable medium described herein may further include operations, features, means, or instructions for performing, based on an unsuccessful decoding procedure, a correction procedure for one or more in-phase (I) or quadrature (Q) samples of the first message based on channel conditions associated with the sidelink communications link, one or more capabilities of the first UE, one or more capabilities of the second UE, or any combination thereof.

In some examples of the method, apparatuses, and non-transitory computer-readable medium described herein, the correction procedure may be for an I/Q imbalance based on the channel conditions associated with the sidelink communications link, the one or more capabilities of the first UE, the one or more capabilities of the second UE, or any combination thereof.

Some examples of the method, apparatuses, and non-transitory computer-readable medium described herein may further include operations, features, means, or instructions for transmitting, to the base station, an indication of a transmission scheme used for transmitting the second message based on the selecting, where the transmission scheme includes an amplify and forward transmission scheme based on an unsuccessful decoding procedure or a decode and forward transmission scheme based on a successful decoding procedure.

In some examples of the method, apparatuses, and non-transitory computer-readable medium described herein, the indication conveys a corresponding reliability for the transmission scheme, where the amplify and forward transmission scheme may be associated with a lower reliability than the decode and forward transmission scheme.

In some examples of the method, apparatuses, and non-transitory computer-readable medium described herein, the indication may be transmitted via a control channel.

Some examples of the method, apparatuses, and non-transitory computer-readable medium described herein may further include operations, features, means, or instructions for receiving the first message via a frequency range 2 (FR2) spectrum band, a sub-6 gigahertz (GHz) spectrum band, a control channel, or any combination thereof.

Some examples of the method, apparatuses, and non-transitory computer-readable medium described herein may further include operations, features, means, or instructions for transmitting the second message using a wider beam or a reduced number of antennas relative to a beam used for communication of the first message based on an unsuccessful decoding procedure.

Some examples of the method, apparatuses, and non-transitory computer-readable medium described herein may further include operations, features, means, or instructions for transmitting the second message using a narrower beam or an increased number of antennas relative to a beam used for communication of the first message based on a successful decoding procedure.

A method of wireless communications at a base station is described. The method may include establishing a first communications link with a first UE that is in communication with a second UE via a sidelink communications link, receiving a first message from the second UE via a second communications link, receiving, from the first UE on the first communications link, a second message that includes a portion of the first message based on a transmission scheme used for transmission of the second message, where the transmission scheme includes one of an amplify and forward transmission scheme or a decode and forward transmission scheme, and performing a joint decoding procedure of the first message and the second message based on the transmission scheme.

An apparatus for wireless communications at a base station is described. The apparatus may include a processor, memory coupled with the processor, and instructions stored in the memory. The instructions may be executable by the processor to cause the apparatus to establish a first communications link with a first UE that is in communication with a second UE via a sidelink communications link, receive a first message from the second UE via a second communications link, receive, from the first UE on the first communications link, a second message that includes a portion of the first message based on a transmission scheme used for transmission of the second message, where the transmission scheme includes one of an amplify and forward transmission scheme or a decode and forward transmission scheme, and perform a joint decoding procedure of the first message and the second message based on the transmission scheme.

Another apparatus for wireless communications at a base station is described. The apparatus may include means for establishing a first communications link with a first UE that is in communication with a second UE via a sidelink communications link, receiving a first message from the second UE via a second communications link, receiving, from the first UE on the first communications link, a second message that includes a portion of the first message based on a transmission scheme used for transmission of the second message, where the transmission scheme includes one of an amplify and forward transmission scheme or a decode and forward transmission scheme, and performing a joint decoding procedure of the first message and the second message based on the transmission scheme.

A non-transitory computer-readable medium storing code for wireless communications at a base station is described. The code may include instructions executable by a processor to establish a first communications link with a first UE that is in communication with a second UE via a sidelink communications link, receive a first message from the second UE via a second communications link, receive, from the first UE on the first communications link, a second message that includes a portion of the first message based on a transmission scheme used for transmission of the second message, where the transmission scheme includes one of an amplify and forward transmission scheme or a decode and forward transmission scheme, and perform a joint decoding procedure of the first message and the second message based on the transmission scheme.

Some examples of the method, apparatuses, and non-transitory computer-readable medium described herein may further include operations, features, means, or instructions for receiving, from the first UE, an indication of the transmission scheme used for transmission of the second message.

Some examples of the method, apparatuses, and non-transitory computer-readable medium described herein may further include operations, features, means, or instructions for determining a set of decoding weights for decoding the second message based on the indication, and performing the joint decoding procedure based on the set of decoding weights.

In some examples of the method, apparatuses, and non-transitory computer-readable medium described herein, the indication conveys a corresponding reliability for the transmission scheme used for transmission of the second message, where the amplify and forward transmission scheme may be associated with a lower reliability than the decode and forward transmission scheme, and where the set of decoding weights may be determined based on the corresponding reliability for the transmission scheme used for transmission of the second message.

Some examples of the method, apparatuses, and non-transitory computer-readable medium described herein may further include operations, features, means, or instructions for receiving the indication via a control channel.

DETAILED DESCRIPTION

Figure 1:
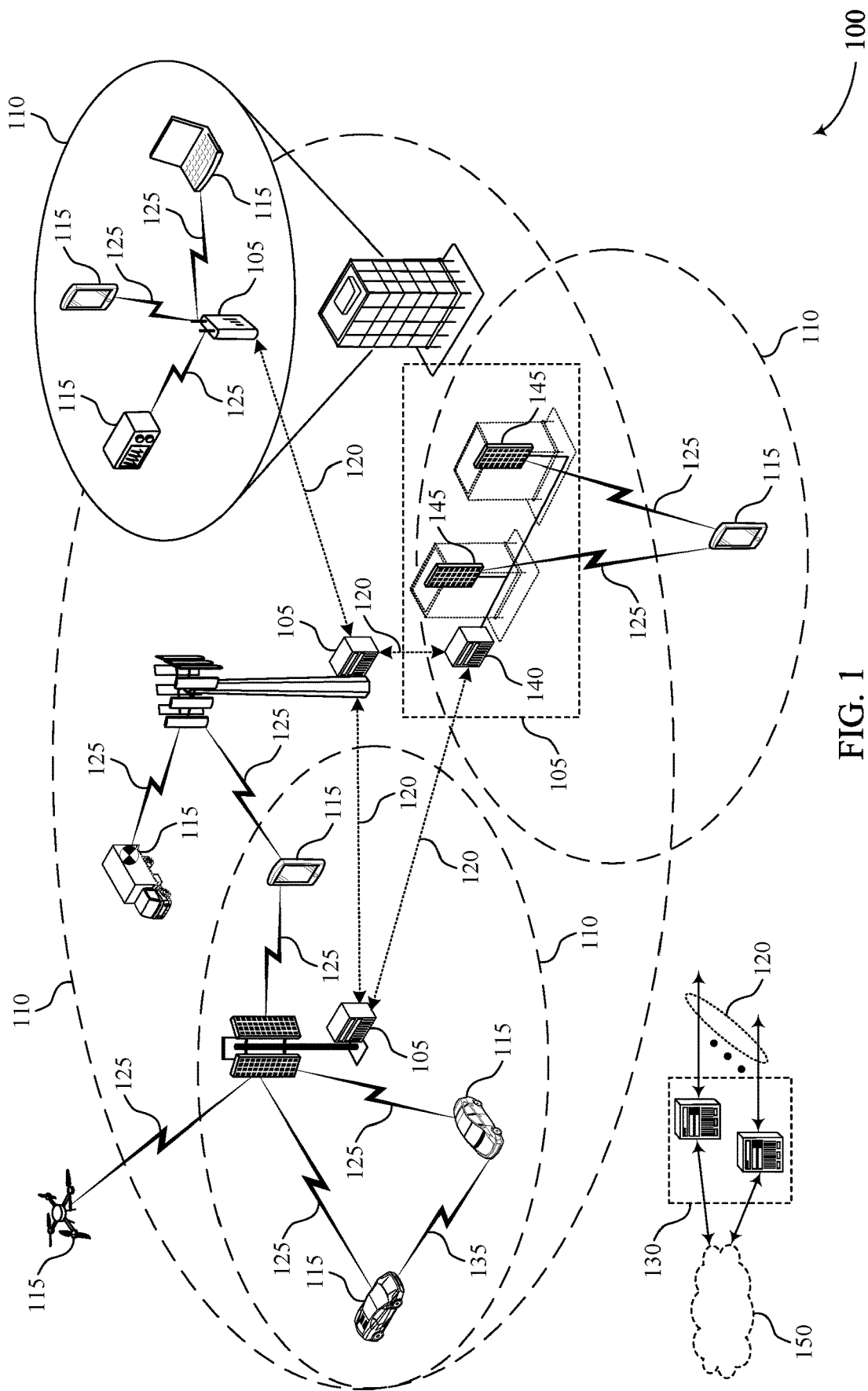
FIGS. 1 and 2 illustrate examples of wireless communications systems that support combining techniques for message forwarding in wireless communications in accordance with aspects of the present disclosure.

A wireless communications system may support both direct links and sidelinks for communications between wireless devices. A direct link may refer to a communication link between a user equipment (UE) and a base station. For example, a direct link may support uplink signaling, downlink signaling, connection procedures, etc. A sidelink may refer to any communication link between similar wireless devices (e.g., a communication link between UEs, a communication link between a sending UE and a relay UE, a backhaul communication link between base stations, etc.). It is noted that while various examples provided herein are discussed for UE sidelink devices, such sidelink techniques may be used for any type of wireless devices that use sidelink communications. For example, a sidelink may support device-to-device (D2D) communications, vehicle-to-everything (V2X) or vehicle-to-vehicle (V2V) communications, message relaying, discovery signaling, beacon signaling, or any combination of these or other signals transmitted over-the-air from one wireless device to one or more other wireless devices.

As demand for wireless communications, sidelink communications, increases, (due to increased V2X demand for autonomous and semi-autonomous vehicles, D2D communication between Internet-of-Things (IoT) devices, factory automation, etc.), techniques to efficiently and reliably enhance throughput and reliability of frequency range 2 (FR2) spectrum wireless communications may be beneficial. The described techniques relate to improved methods, systems, devices, and apparatuses that support FR2 spectrum wireless communications between at least one UE and a base station. Generally, the described techniques provide for efficient transmissions between a first UE (UE1), a second relay UE (UE2), and a base station utilizing a millimeter wave (mmW) frequency band (e.g., FR2, frequency range 4 (FR4), etc.) by facilitating use of multiple transmission schemes as part of a single transmission based on a plurality of determined factors at the UEs, the base station, and within the transmission itself.

In some examples of a wireless communications system, UE1 may send a transmission to the base station over a direct link or UE1 may send the transmission to the base station via an indirect link, or sidelink, with UE2. In some cases, UE2 may receive the transmission from UE1 via the sidelink and may then forward the received transmission to the base station. In some cases, UE2 may select one or more of the amplify and forward (AF) scheme or the decode and forward (DF) scheme to forward the received transmission to the base station. In some cases, UE2 may attempt to decode the received transmission from UE1 and determine if the transmission has been successfully decoded based on a cyclic redundancy check (CRC) code performed on the received transmission. If UE2 is successful at decoding the complete received transmission, UE2 may solely utilize the DF scheme to transmit the received and decoded transmission to the gNB. Additionally or alternatively, UE2 may transmit the re-encoded portions of the received transmission using the DF scheme and may transmit, using the AF scheme, the portions of the received transmission that were not decoded or unable to be successfully decoded. In some cases, when using the AF scheme during the forwarding process, UE2 may correct or compensate for an in-phase signal/quadrature signal (I/Q) amplitude imbalance based on one or more factors at UE1, UE2, or the base station.

In some examples, the base station may utilize improved decoding techniques to decode the portions of the received transmission from UE2 that have been forwarded from UE1 by UE2. In some cases, improved decoding techniques at the base station may include a relatively lower noise figure; a greater number of radio frequency (RF) chains; enhanced transmission or reception; or enhanced computational and energy efficient processing capabilities. In some cases, the UE2 transmits a signal to the base station to indicate whether UE2 utilized the AF scheme, the DF scheme, or a combination of the AF scheme and the DF scheme during forwarding of the received transmission from UE1. In some cases, receipt by the base station of the signal from UE2 facilitates determination by the base station of relative weights, via log-likelihood radio (LLR) combining, of the portions of the transmission received from UE2.

Particular aspects of the subject matter described herein may be implemented to realize one or more advantages. The described techniques may support improving communications using mmW transmissions, decreasing signaling overhead, and improving reliability, among other advantages. As such, supported techniques may include improved network operations and, in some examples, may promote network efficiencies, among other benefits.

Aspects of the disclosure are initially described in the context of wireless communications systems. Aspects are then described with respect to a process flow. Aspects of the disclosure are further illustrated by and described with reference to apparatus diagrams, system diagrams, and flowcharts that relate to combining techniques for message forwarding in wireless communications.

FIG. 1 illustrates an example of a wireless communications system 100 that supports combining techniques for message forwarding in wireless communications in accordance with aspects of the present disclosure. The wireless communications system 100 may include one or more base stations 105, one or more UEs 115, and a core network 130. In some examples, the wireless communications system 100 may be a Long Term Evolution (LTE) network, an LTE-Advanced (LTE-A) network, an LTE-A Pro network, or a New Radio (NR) network. In some examples, the wireless communications system 100 may support enhanced broadband communications, ultra-reliable (e.g., mission critical) communications, low latency communications, communications with low-cost and low-complexity devices, or any combination thereof.

The base stations 105 may be dispersed throughout a geographic area to form the wireless communications system 100 and may be devices in different forms or having different capabilities. The base stations 105 and the UEs 115 may wirelessly communicate via one or more communication links 125. Each base station 105 may provide a coverage area 110 over which the UEs 115 and the base station 105 may establish one or more communication links 125. The coverage area 110 may be an example of a geographic area over which a base station 105 and a UE 115 may support the communication of signals according to one or more radio access technologies.

The UEs 115 may be dispersed throughout a coverage area 110 of the wireless communications system 100, and each UE 115 may be stationary, or mobile, or both at different times. The UEs 115 may be devices in different forms or having different capabilities. Some example UEs 115 are illustrated in FIG. 1. The UEs 115 described herein may be able to communicate with various types of devices, such as other UEs 115, the base stations 105, or network equipment (e.g., core network nodes, relay devices, integrated access and backhaul (IAB) nodes, or other network equipment), as shown in FIG. 1.

The base stations 105 may communicate with the core network 130, or with one another, or both. For example, the base stations 105 may interface with the core network 130 through one or more backhaul links 120 (e.g., via an S1, N2, N3, or other interface). The base stations 105 may communicate with one another over the backhaul links 120 (e.g., via an X2, Xn, or other interface) either directly (e.g., directly between base stations 105), or indirectly (e.g., via core network 130), or both. In some examples, the backhaul links 120 may be or include one or more wireless links.

One or more of the base stations 105 described herein may include or may be referred to by a person having ordinary skill in the art as a base transceiver station, a radio base station, an access point, a radio transceiver, a NodeB, an eNodeB (eNB), a next-generation NodeB or a giga-NodeB (either of which may be referred to as a gNB), a Home NodeB, a Home eNodeB, or other suitable terminology.

A UE 115 may include or may be referred to as a mobile device, a wireless device, a remote device, a handheld device, or a subscriber device, or some other suitable terminology, where the "device" may also be referred to as a unit, a station, a terminal, or a client, among other examples. A UE 115 may also include or may be referred to as a personal electronic device such as a cellular phone, a personal digital assistant (PDA), a tablet computer, a laptop computer, or a personal computer. In some examples, a UE 115 may include or be referred to as a wireless local loop (WLL) station, an Internet of Things (IoT) device, an Internet of Everything (IoE) device, or a machine type communications (MTC) device, among other examples, which may be implemented in various objects such as appliances, or vehicles, meters, among other examples.

The UEs 115 described herein may be able to communicate with various types of devices, such as other UEs 115 that may sometimes act as relays as well as the base stations 105 and the network equipment including macro eNBs or gNBs, small cell eNBs or gNBs, or relay base stations, among other examples, as shown in FIG. 1.

The UEs 115 and the base stations 105 may wirelessly communicate with one another via one or more communication links 125 over one or more carriers. The term "carrier" may refer to a set of radio frequency spectrum resources having a defined physical layer structure for supporting the communication links 125. For example, a carrier used for a communication link 125 may include a portion of a radio frequency spectrum band (e.g., a bandwidth part (BWP)) that is operated according to one or more physical layer channels for a given radio access technology (e.g., LTE, LTE-A, LTE-A Pro, NR). Each physical layer channel may carry acquisition signaling (e.g., synchronization signals, system information), control signaling that coordinates operation for the carrier, user data, or other signaling. The wireless communications system 100 may support communication with a UE 115 using carrier aggregation or multi-carrier operation. A UE 115 may be configured with multiple downlink component carriers and one or more uplink component carriers according to a carrier aggregation configuration. Carrier aggregation may be used with both frequency division duplexing (FDD) and time division duplexing (TDD) component carriers.

In some examples (e.g., in a carrier aggregation configuration), a carrier may also have acquisition signaling or control signaling that coordinates operations for other carriers. A carrier may be associated with a frequency channel (e.g., an evolved universal mobile telecommunication system terrestrial radio access (E-UTRA) absolute radio frequency channel number (EARFCN)) and may be positioned according to a channel raster for discovery by the UEs 115. A carrier may be operated in a standalone mode where initial acquisition and connection may be conducted by the UEs 115 via the carrier, or the carrier may be operated in a non-standalone mode where a connection is anchored using a different carrier (e.g., of the same or a different radio access technology).

The communication links 125 shown in the wireless communications system 100 may include uplink transmissions from a UE 115 to a base station 105, or downlink transmissions from a base station 105 to a UE 115. Carriers may carry downlink or uplink communications (e.g., in an FDD mode) or may be configured to carry downlink and uplink communications (e.g., in a TDD mode).

A carrier may be associated with a particular bandwidth of the radio frequency spectrum, and in some examples the carrier bandwidth may be referred to as a "system bandwidth" of the carrier or the wireless communications system 100. For example, the carrier bandwidth may be one of a number of determined bandwidths for carriers of a particular radio access technology (e.g., 1.4, 3, 5, 10, 15, 20, 40, or 80 megahertz (MHz)). Devices of the wireless communications system 100 (e.g., the base stations 105, the UEs 115, or both) may have hardware configurations that support communications over a particular carrier bandwidth or may be configurable to support communications over one of a set of carrier bandwidths. In some examples, the wireless communications system 100 may include base stations 105 or UEs 115 that support simultaneous communications via carriers associated with multiple carrier bandwidths. In some examples, each served UE 115 may be configured for operating over portions (e.g., a sub-band, a BWP) or all of a carrier bandwidth.

Signal waveforms transmitted over a carrier may be made up of multiple subcarriers (e.g., using multi-carrier modulation (MCM) techniques such as orthogonal frequency division multiplexing (OFDM) or discrete Fourier transform spread OFDM (DFT-s-OFDM)). In a system employing MCM techniques, a resource element may include a symbol period (e.g., a duration of one modulation symbol) and one subcarrier, where the symbol period and subcarrier spacing are inversely related. The number of bits carried by each resource element may depend on the modulation scheme (e.g., the order of the modulation scheme, the coding rate of the modulation scheme, or both). Thus, the more resource elements that a UE 115 receives and the higher the order of the modulation scheme, the higher the data rate may be for the UE 115. A wireless communications resource may refer to a combination of a radio frequency spectrum resource, a time resource, and a spatial resource (e.g., spatial layers or beams), and the use of multiple spatial layers may further increase the data rate or data reliability for communications with a UE 115.

One or more numerologies for a carrier may be supported, where a numerology may include a subcarrier spacing ($\Delta f$) and a cyclic prefix. A carrier may be divided into one or more BWPs having the same numerology. In some examples, a UE 115 may be configured with multiple BWPs. In some examples, a single BWP for a carrier may be active at a given time and communications for the UE 115 may be restricted to one or more active BWPs.

The time intervals for the base stations 105 or the UEs 115 may be expressed in multiples of a basic time unit which may, for example, refer to a sampling period of $T_s=1/(\Delta f_{max} \cdot N_f)$ seconds, where $\Delta f_{max}$ may represent the maximum supported subcarrier spacing, and $N_f$ may represent the maximum supported discrete Fourier transform (DFT) size. Time intervals of a communications resource may be organized according to radio frames each having a specified duration (e.g., 10 milliseconds (ms)). Each radio frame may be identified by a system frame number (SFN) (e.g., ranging from 0 to 1023).

Each frame may include multiple consecutively numbered subframes or slots, and each subframe or slot may have the same duration. In some examples, a frame may be divided (e.g., in the time domain) into subframes, and each subframe may be further divided into a number of slots. Alternatively, each frame may include a variable number of slots, and the number of slots may depend on subcarrier spacing. Each slot may include a number of symbol periods (e.g., depending on the length of the cyclic prefix prepended to each symbol period). In some wireless communications systems 100, a slot may further be divided into multiple mini-slots containing one or more symbols. Excluding the cyclic prefix, each symbol period may contain one or more (e.g., $N_f$) sampling periods. The duration of a symbol period may depend on the subcarrier spacing or frequency band of operation.

A subframe, a slot, a mini-slot, or a symbol may be the smallest scheduling unit (e.g., in the time domain) of the wireless communications system 100 and may be referred to as a transmission time interval (TTI). In some examples, the TTI duration (e.g., the number of symbol periods in a TTI) may be variable. Additionally or alternatively, the smallest scheduling unit of the wireless communications system 100 may be dynamically selected (e.g., in bursts of shortened TTIs (sTTIs)).

Physical channels may be multiplexed on a carrier according to various techniques. A physical control channel and a physical data channel may be multiplexed on a downlink carrier, for example, using one or more of time division multiplexing (TDM) techniques, frequency division multiplexing (FDM) techniques, or hybrid TDM-FDM techniques. A control region (e.g., a control resource set (CORESET)) for a physical control channel may be defined by a number of symbol periods and may extend across the system bandwidth or a subset of the system bandwidth of the carrier. One or more control regions (e.g., CORESETs) may be configured for a set of the UEs 115. For example, one or more of the UEs 115 may monitor or search control regions for control information according to one or more search space sets, and each search space set may include one or multiple control channel candidates in one or more aggregation levels arranged in a cascaded manner. An aggregation level for a control channel candidate may refer to a number of control channel resources (e.g., control channel elements (CCEs)) associated with encoded information for a control information format having a given payload size. Search space sets may include common search space sets configured for sending control information to multiple UEs 115 and UE-specific search space sets for sending control information to a specific UE 115.

Each base station 105 may provide communication coverage via one or more cells, for example a macro cell, a small cell, a hot spot, or other types of cells, or any combination thereof. The term "cell" may refer to a logical communication entity used for communication with a base station 105 (e.g., over a carrier) and may be associated with an identifier for distinguishing neighboring cells (e.g., a physical cell identifier (PCID), a virtual cell identifier (VCID), or others). In some examples, a cell may also refer to a geographic coverage area 110 or a portion of a geographic coverage area 110 (e.g., a sector) over which the logical communication entity operates. Such cells may range from smaller areas (e.g., a structure, a subset of structure) to larger areas depending on various factors such as the capabilities of the base station 105. For example, a cell may be or include a building, a subset of a building, or exterior spaces between or overlapping with geographic coverage areas 110, among other examples.

A macro cell generally covers a relatively large geographic area (e.g., several kilometers in radius) and may allow unrestricted access by the UEs 115 with service subscriptions with the network provider supporting the macro cell. A small cell may be associated with a lower-powered base station 105, as compared with a macro cell, and a small cell may operate in the same or different (e.g., licensed, unlicensed) frequency bands as macro cells. Small cells may provide unrestricted access to the UEs 115 with service subscriptions with the network provider or may provide restricted access to the UEs 115 having an association with the small cell (e.g., the UEs 115 in a closed subscriber group (CSG), the UEs 115 associated with users in a home or office). A base station 105 may support one or multiple cells and may also support communications over the one or more cells using one or multiple component carriers.

In some examples, a carrier may support multiple cells, and different cells may be configured according to different protocol types (e.g., MTC, narrowband IoT (NB-IoT), enhanced mobile broadband (eMBB)) that may provide access for different types of devices.

In some examples, a base station 105 may be movable and therefore provide communication coverage for a moving geographic coverage area 110. In some examples, different geographic coverage areas 110 associated with different technologies may overlap, but the different geographic coverage areas 110 may be supported by the same base station 105. In other examples, the overlapping geographic coverage areas 110 associated with different technologies may be supported by different base stations 105. The wireless communications system 100 may include, for example, a heterogeneous network in which different types of the base stations 105 provide coverage for various geographic coverage areas 110 using the same or different radio access technologies.

The wireless communications system 100 may support synchronous or asynchronous operation. For synchronous operation, the base stations 105 may have similar frame timings, and transmissions from different base stations 105 may be approximately aligned in time. For asynchronous operation, the base stations 105 may have different frame timings, and transmissions from different base stations 105 may, in some examples, not be aligned in time. The techniques described herein may be used for either synchronous or asynchronous operations.

Some UEs 115, such as MTC or IoT devices, may be low cost or low complexity devices and may provide for automated communication between machines (e.g., via Machine-to-Machine (M2M) communication). M2M communication or MTC may refer to data communication technologies that allow devices to communicate with one another or a base station 105 without human intervention. In some examples, M2M communication or MTC may include communications from devices that integrate sensors or meters to measure or capture information and relay such information to a central server or application program that makes use of the information or presents the information to humans interacting with the application program. Some UEs 115 may be designed to collect information or enable automated behavior of machines or other devices. Examples of applications for MTC devices include smart metering, inventory monitoring, water level monitoring, equipment monitoring, healthcare monitoring, wildlife monitoring, weather and geological event monitoring, fleet management and tracking, remote security sensing, physical access control, and transaction-based business charging.

Some UEs 115 may be configured to employ operating modes that reduce power consumption, such as half-duplex communications (e.g., a mode that supports one-way communication via transmission or reception, but not transmission and reception simultaneously). In some examples, half-duplex communications may be performed at a reduced peak rate. Other power conservation techniques for the UEs 115 include entering a power saving deep sleep mode when not engaging in active communications, operating over a limited bandwidth (e.g., according to narrowband communications), or a combination of these techniques. For example, some UEs 115 may be configured for operation using a narrowband protocol type that is associated with a defined portion or range (e.g., set of subcarriers or resource blocks (RBs)) within a carrier, within a guard-band of a carrier, or outside of a carrier.

The wireless communications system 100 may be configured to support ultra-reliable communications or low-latency communications, or various combinations thereof. For example, the wireless communications system 100 may be configured to support ultra-reliable low-latency communications (URLLC) or mission critical communications. The UEs 115 may be designed to support ultra-reliable, low-latency, or critical functions (e.g., mission critical functions). Ultra-reliable communications may include private communication or group communication and may be supported by one or more mission critical services such as mission critical push-to-talk (MCPTT), mission critical video (MCVideo), or mission critical data (MCData). Support for mission critical functions may include prioritization of services, and mission critical services may be used for public safety or general commercial applications. The terms ultra-reliable, low-latency, mission critical, and ultra-reliable low-latency may be used interchangeably herein.

In some examples, a UE 115 may also be able to communicate directly with other UEs 115 over a D2D communication link 135 (e.g., using a peer-to-peer (P2P) or D2D protocol). One or more UEs 115 utilizing D2D communications may be within the geographic coverage area 110 of a base station 105. Other UEs 115 in such a group may be outside the geographic coverage area 110 of a base station 105 or be otherwise unable to receive transmissions from a base station 105. In some examples, groups of the UEs 115 communicating via D2D communications may utilize a one-to-many (1:M) system in which each UE 115 transmits to every other UE 115 in the group. In some examples, a base station 105 facilitates the scheduling of resources for D2D communications. In other cases, D2D communications are carried out between the UEs 115 without the involvement of a base station 105.

In some systems, the D2D communication link 135 may be an example of a communication channel, such as a sidelink communication channel, between vehicles (e.g., UEs 115). In some examples, vehicles may communicate using V2X communications, V2V communications, or some combination of these. A vehicle may signal information related to traffic conditions, signal scheduling, weather, safety, emergencies, or any other information relevant to a V2X system. In some examples, vehicles in a V2X system may communicate with roadside infrastructure, such as roadside units, or with the network via one or more network nodes (e.g., base stations 105) using vehicle-to-network (V2N) communications, or with both.

The core network 130 may provide user authentication, access authorization, tracking, Internet Protocol (IP) connectivity, and other access, routing, or mobility functions. The core network 130 may be an evolved packet core (EPC) or 5G core (5GC), which may include at least one control plane entity that manages access and mobility (e.g., a mobility management entity (MME), an access and mobility management function (AMF)) and at least one user plane entity that routes packets or interconnects to external networks (e.g., a serving gateway (S-GW), a Packet Data Network (PDN) gateway (P-GW), or a user plane function (UPF)). The control plane entity may manage non-access stratum (NAS) functions such as mobility, authentication, and bearer management for the UEs 115 served by the base stations 105 associated with the core network 130. User IP packets may be transferred through the user plane entity, which may provide IP address allocation as well as other functions. The user plane entity may be connected to the network operators IP services 150. The operators IP services 150 may include access to the Internet, Intranet(s), an IP Multimedia Subsystem (IMS), or a Packet-Switched Streaming Service.

Some of the network devices, such as a base station 105, may include subcomponents such as an access network entity 140, which may be an example of an access node controller (ANC). Each access network entity 140 may communicate with the UEs 115 through one or more other access network transmission entities 145, which may be referred to as radio heads, smart radio heads, or transmission/reception points (TRPs). Each access network transmission entity 145 may include one or more antenna panels. In some configurations, various functions of each access network entity 140 or base station 105 may be distributed across various network devices (e.g., radio heads and ANCs) or consolidated into a single network device (e.g., a base station 105).

The wireless communications system 100 may operate using one or more frequency bands, typically in the range of 300 megahertz (MHz) to 300 GHz. Generally, the region from 300 MHz to 3 GHz is known as the ultra-high frequency (UHF) region or decimeter band because the wavelengths range from approximately one decimeter to one meter in length. The UHF waves may be blocked or redirected by buildings and environmental features, but the waves may penetrate structures sufficiently for a macro cell to provide service to the UEs 115 located indoors. The transmission of UHF waves may be associated with smaller antennas and shorter ranges (e.g., less than 100 kilometers) compared to transmission using the smaller frequencies and longer waves of the high frequency (HF) or very high frequency (VHF) portion of the spectrum below 300 MHz.

The wireless communications system 100 may also operate in a super high frequency (SHF) region using frequency bands from 3 GHz to 30 GHz, also known as the centimeter band, or in an extremely high frequency (EHF) region of the spectrum (e.g., from 30 GHz to 300 GHz), also known as the millimeter band. In some examples, the wireless communications system 100 may support mmW communications between the UEs 115 and the base stations 105, and EHF antennas of the respective devices may be smaller and more closely spaced than UHF antennas. In some examples, this may facilitate use of antenna arrays within a device. The propagation of EHF transmissions, however, may be subject to even greater atmospheric attenuation and shorter range than SHF or UHF transmissions. The techniques disclosed herein may be employed across transmissions that use one or more different frequency regions, and designated use of bands across these frequency regions may differ by country or regulating body.

The wireless communications system 100 may utilize both licensed and unlicensed radio frequency spectrum bands. For example, the wireless communications system 100 may employ License Assisted Access (LAA), LTE-Unlicensed (LTE-U) radio access technology, or NR technology in an unlicensed band such as the 5 GHz industrial, scientific, and medical (ISM) band. When operating in unlicensed radio frequency spectrum bands, devices such as the base stations 105 and the UEs 115 may employ carrier sensing for collision detection and avoidance. In some examples, operations in unlicensed bands may be based on a carrier aggregation configuration in conjunction with component carriers operating in a licensed band (e.g., LAA). Operations in unlicensed spectrum may include downlink transmissions, uplink transmissions, P2P transmissions, or D2D transmissions, among other examples.

A base station 105 or a UE 115 may be equipped with multiple antennas, which may be used to employ techniques such as transmit diversity, receive diversity, multiple-input multiple-output (MIMO) communications, or beamforming. The antennas of a base station 105 or a UE 115 may be located within one or more antenna arrays or antenna panels, which may support MIMO operations or transmit or receive beamforming. For example, one or more base station antennas or antenna arrays may be co-located at an antenna assembly, such as an antenna tower. In some examples, antennas or antenna arrays associated with a base station 105 may be located in diverse geographic locations. A base station 105 may have an antenna array with a number of rows and columns of antenna ports that the base station 105 may use to support beamforming of communications with a UE 115. Likewise, a UE 115 may have one or more antenna arrays that may support various MIMO or beamforming operations. Additionally or alternatively, an antenna panel may support radio frequency beamforming for a signal transmitted via an antenna port.

The base stations 105 or the UEs 115 may use MIMO communications to exploit multipath signal propagation and increase the spectral efficiency by transmitting or receiving multiple signals via different spatial layers. Such techniques may be referred to as spatial multiplexing. The multiple signals may, for example, be transmitted by the transmitting device via different antennas or different combinations of antennas. Likewise, the multiple signals may be received by the receiving device via different antennas or different combinations of antennas. Each of the multiple signals may be referred to as a separate spatial stream and may carry bits associated with the same data stream (e.g., the same codeword) or different data streams (e.g., different codewords). Different spatial layers may be associated with different antenna ports used for channel measurement and reporting. MIMO techniques include single-user MIMO (SU-MIMO), where multiple spatial layers are transmitted to the same receiving device, and multiple-user MIMO (MU-MIMO), where multiple spatial layers are transmitted to multiple devices.

Beamforming, which may also be referred to as spatial filtering, directional transmission, or directional reception, is a signal processing technique that may be used at a transmitting device or a receiving device (e.g., a base station 105, a UE 115) to shape or steer an antenna beam (e.g., a transmit beam, a receive beam) along a spatial path between the transmitting device and the receiving device. Beamforming may be achieved by combining the signals communicated via antenna elements of an antenna array such that some signals propagating at particular orientations with respect to an antenna array experience constructive interference while others experience destructive interference. The adjustment of signals communicated via the antenna elements may include a transmitting device or a receiving device applying amplitude offsets, phase offsets, or both to signals carried via the antenna elements associated with the device. The adjustments associated with each of the antenna elements may be defined by a beamforming weight set associated with a particular orientation (e.g., with respect to the antenna array of the transmitting device or receiving device, or with respect to some other orientation).

A base station 105 or a UE 115 may use beam sweeping techniques as part of beamforming operations. For example, a base station 105 may use multiple antennas or antenna arrays (e.g., antenna panels) to conduct beamforming operations for directional communications with a UE 115. Some signals (e.g., synchronization signals, reference signals, beam selection signals, or other control signals) may be transmitted by a base station 105 multiple times in different directions. For example, the base station 105 may transmit a signal according to different beamforming weight sets associated with different directions of transmission. Transmissions in different beam directions may be used to identify (e.g., by a transmitting device, such as a base station 105, or by a receiving device, such as a UE 115) a beam direction for later transmission or reception by the base station 105.

Some signals, such as data signals associated with a particular receiving device, may be transmitted by a base station 105 in a single beam direction (e.g., a direction associated with the receiving device, such as a UE 115). In some examples, the beam direction associated with transmissions along a single beam direction may be determined based on a signal that was transmitted in one or more beam directions. For example, a UE 115 may receive one or more of the signals transmitted by the base station 105 in different directions and may report to the base station 105 an indication of the signal that the UE 115 received with a highest signal quality or an otherwise acceptable signal quality.

In some examples, transmissions by a device (e.g., by a base station 105 or a UE 115) may be performed using multiple beam directions, and the device may use a combination of digital precoding or radio frequency beamforming to generate a combined beam for transmission (e.g., from a base station 105 to a UE 115). The UE 115 may report feedback that indicates precoding weights for one or more beam directions, and the feedback may correspond to a configured number of beams across a system bandwidth or one or more sub-bands. The base station 105 may transmit a reference signal (e.g., a cell-specific reference signal (CRS), a channel state information reference signal (CSI-RS)), which may be precoded or unprecoded. The UE 115 may provide feedback for beam selection, which may be a precoding matrix indicator (PMI) or codebook-based feedback (e.g., a multi-panel type codebook, a linear combination type codebook, a port selection type codebook). Although these techniques are described with reference to signals transmitted in one or more directions by a base station 105, a UE 115 may employ similar techniques for transmitting signals multiple times in different directions (e.g., for identifying a beam direction for subsequent transmission or reception by the UE 115) or for transmitting a signal in a single direction (e.g., for transmitting data to a receiving device).

A receiving device (e.g., a UE 115) may try multiple receive configurations (e.g., directional listening) when receiving various signals from the base station 105, such as synchronization signals, reference signals, beam selection signals, or other control signals. For example, a receiving device may try multiple receive directions by receiving via different antenna subarrays, by processing received signals according to different antenna subarrays, by receiving according to different receive beamforming weight sets (e.g., different directional listening weight sets) applied to signals received at multiple antenna elements of an antenna array, or by processing received signals according to different receive beamforming weight sets applied to signals received at multiple antenna elements of an antenna array, any of which may be referred to as "listening" according to different receive configurations or receive directions. In some examples, a receiving device may use a single receive configuration to receive along a single beam direction (e.g., when receiving a data signal). The single receive configuration may be aligned in a beam direction determined based on listening according to different receive configuration directions (e.g., a beam direction determined to have a highest signal strength, highest signal-to-noise ratio (SNR), or otherwise acceptable signal quality based on listening according to multiple beam directions).

The wireless communications system 100 may be a packet-based network that operates according to a layered protocol stack. In the user plane, communications at the bearer or Packet Data Convergence Protocol (PDCP) layer may be IP-based. A Radio Link Control (RLC) layer may perform packet segmentation and reassembly to communicate over logical channels. A Medium Access Control (MAC) layer may perform priority handling and multiplexing of logical channels into transport channels. The MAC layer may also use error detection techniques, error correction techniques, or both to support retransmissions at the MAC layer to improve link efficiency. In the control plane, the Radio Resource Control (RRC) protocol layer may provide establishment, configuration, and maintenance of an RRC connection between a UE 115 and a base station 105 or a core network 130 supporting radio bearers for user plane data. At the physical layer, transport channels may be mapped to physical channels.

The UEs 115 and the base stations 105 may support retransmissions of data to increase the likelihood that data is received successfully. Hybrid automatic repeat request (HARQ) feedback is one technique for increasing the likelihood that data is received correctly over a communication link 125. HARQ may include a combination of error detection (e.g., using a CRC), forward error correction (FEC), and retransmission (e.g., automatic repeat request (ARQ)). HARQ may improve throughput at the MAC layer in poor radio conditions (e.g., low signal-to-noise conditions). In some examples, a device may support same-slot HARQ feedback, where the device may provide HARQ feedback in a specific slot for data received in a previous symbol in the slot. In other cases, the device may provide HARQ feedback in a subsequent slot, or according to some other time interval.

In some examples, a UE 115 in wireless communications system 100 may be in communication with another UE 115 via a sidelink communications link (e.g., D2D communications link 135). The UE 115 may receive a message from the other UE 115 and may forward the message to a base station 105. Prior to forwarding, the UE 115 may select a transmission scheme, such as an AF or DF transmission scheme, and may use the selected transmission scheme for forwarding the message to the base station 105. The transmission scheme may be selected after the UE 115 performs decoding on the message received from the other UE 115, and based on the success or failure of the decoding, the UE 115 may perform AF or DF. In some cases, a portion of the message received from the other UE 115 may be successfully decoded, and another portion of the message may fail decoding. In such cases, the UE 115 may utilize a combination of AF and DF. That is, the UE 115 may perform DF on the portion that was successfully decoded and AF on the portion that was not successfully decoded.

A base station 105 may receive the forwarded message from the UE 115 and in some cases, may receive a message directly from the other UE 115, and the base station 105 may perform a joint decoding procedure on both the messages. The joint decoding procedure may be performed based on decoding weights determined by the base station 105, which may be calculated based on whether AF or DF was used for forwarding the message to the base station 105.

Figure 2:
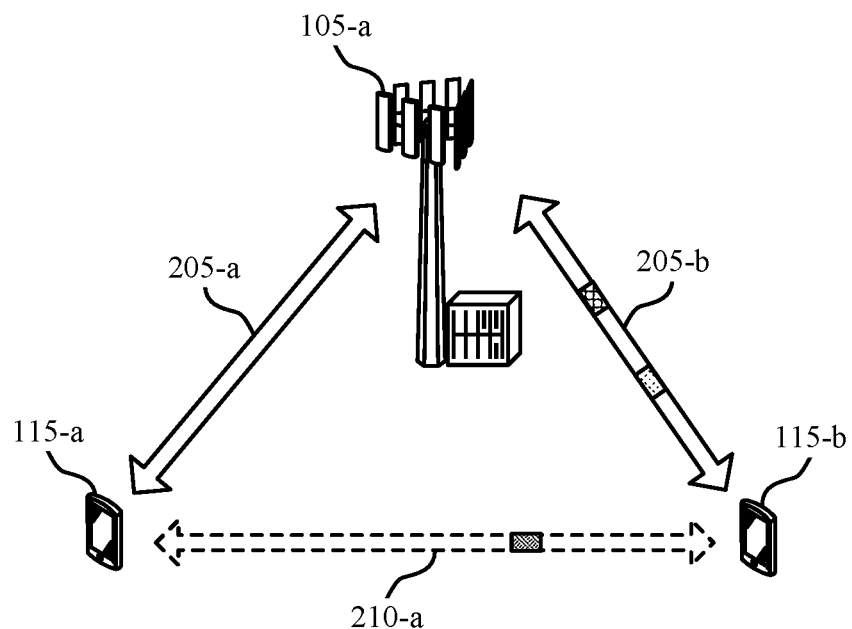
Figure 2:
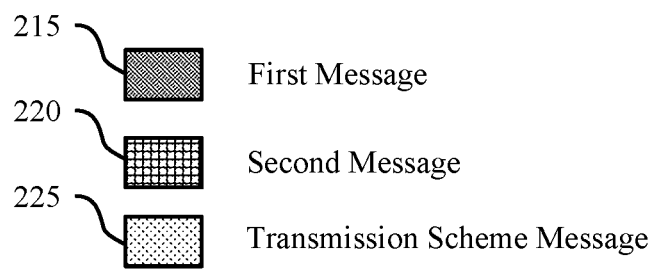

FIG. 2 illustrates an example of a wireless communications system 200 that supports combining techniques for message forwarding in wireless communications in accordance with aspects of the present disclosure. In some examples, wireless communications system 200 may implement aspects of wireless communications system 100. In some examples, the wireless communications system 200 may include a UE 115-a, a UE 115-b, and a base station 105-a that may be examples of UEs 115 and base stations 105 described with reference to FIG. 1. In this example, UE 115-a may function as a sending UE 115 and UE 115-b may function as a relay UE 115. One or more of the UEs 115 may communicate with base station 105 using a corresponding direct link 205. In this example, base station 105-a may communicate with UE 115-a via direct link 205-a and may communicate with UE 115-b via direct link 205-b.

In some examples, the UEs 115 may communicate with one or more UEs 115 using a corresponding sidelink 210. In this example, UE 115-a may communicate with UE 115-b via sidelink 210-a. In this example, UE 115-a and 115-b may be members of a sidelink communications group, in which members of the group may communicate with other members of the group to provide data or other information via sidelinks, such as sidelink 210-a. In some cases, an applications layer at base station 105-a may prompt creation of the sidelink communications group, and the group may be established through communications with the applications layer of other UEs 115 in the group. It is noted that the illustrated sidelink communications group provides communication between two UEs 115, which are illustrated in wireless communications system 200 for the sake of brevity, and the techniques described herein may be applicable to any number of UEs 115 within a system that may establish a communications group. Further, sidelink communication techniques may be used for D2D communication of wireless devices other than UEs, such as base station communications (e.g., wireless backhaul links between base stations or TRPs, etc.), communications between access points, and the like.

In some examples, UE 115-a may transmit a first message 215 via sidelink 210-a to UE 115-b for forwarding to base station 105-a. In such examples, UE 115-b may determine, based on a number of factors, to perform one of the AF or DF transmission schemes on first message 215 as part of the forwarding of first message 215 to base station 105-a in the form of a second message 220. In a DF transmission scheme, the UE 115-b may decode the first message 215 and encode (e.g., re-encode) the decoded first message 215 to form second message 220 prior to forwarding the second message 220 to base station 105-a. In an AF transmission scheme, the UE 115-b may refrain from decoding the first message 215, and may instead amplify at least a portion of the received first message 215 to form second message 220 prior to forwarding second message 220 to the base station 105-a. The UE 115-b may therefore act as a relay, an analog or digital repeater, a customer premises equipment (CPE), or another suitable device.

In some cases, UE 115-b may receive first message 215 and perform a decoding process on the encoded first message 215. In some examples, UE 115-b may successfully decode first message 215 and based on a successful decoding, UE 115-b may select a DF transmission scheme for forwarding the first message 215 to the base station 105-a. In some cases, UE 115-b may re-encode the decoded first message 215 and forward the re-encoded portions of first message 215 to base station 105-a as second message 220.

In other examples, UE 115-b may attempt to perform the decoding process on the encoded first message 215 but may be unable to decode some or all of first message 215. In such examples, UE 115-b may select to perform the AF transmission scheme on the non-decoded first message 215 by amplifying and forwarding first message 215 as second message 220 to base station 105-a. In some examples, as part of performing the AF transmission scheme, UE 115-b may forward I/Q portions of first message 215 as second message 220 to base station 105-a. Additionally or alternatively, as part of the AF transmission scheme, UE 115-b may perform an I/Q compensation and correction on first message 215. In such examples, UE 115-b may make corrections to an I/Q imbalance present in first message 215 based on one or more of parameters associated with sidelink 210-a, one or more capabilities or parameters associated with UE 115-b, or one or more capabilities or parameters associated with base station 105-a.

In some cases, UE 115-b may perform both of the AF and DF transmission schemes on first message 215. For instance, UE 115-b may, after attempting to perform decoding on all or some of first message 215, determine if decoding of all or some of first message 215 was successful. In such examples, UE 115-b may determine a success of the decoding process by performing a CRC on the first message 215. Based on the output of the CRC, UE 115-b may determine if all or some of first message 215 is successfully decoded.

In some examples, UE 115-b may re-encode a portion of first message 215 that has been determined to have been successfully decoded during the decoding process. In such examples, UE 115-b may amplify and correct I/Q imbalances in a portion of first message 215 that has been determined to have not been successfully decoded during the decoding process before forwarding the re-encoded portion and the non-decoded portion to base station 105-a in the form of second message 220.

In some cases, base station 105-a may receive second message 220 from UE 115-b and may perform a decoding process on portions of second message 220 containing portions of first message 215 that were not decoded by UE 115-b. In some examples, base station 105-a may include improved hardware and operating parameters as compared to UE 115-b and may have improved decoding capabilities as compared to UE 115-b. For example, base station 105-a may be a centrally located device that may be capable of processing lower SNRs as compared to UE 115-b, or the base station 105-a may have improved hardware or higher thermal overhead mitigation capabilities as compared to UE 115-b. Further, the base station 105-a may have a greater number of RF chains, improved reception sensitivity, or greater power availability as compared to UE 115-*b*, among other factors.

In some examples, after having performed one or both of the AF or DF transmission schemes on first message 215 and transmitted second message 220 to base station 105-*a*, UE 115-*b* may transmit a transmission scheme message 225 to base station 105-*a*. In some examples, transmission scheme message 225 may include an indication of whether UE 115-*b* has performed one or both of the AF or DF transmission schemes on first message 215. In some cases, the transmission scheme message 225 may include an indication of the portions of first message 215 and the corresponding transmission scheme used on each portion. In some cases, UE 115-*b* may transmit transmission scheme message 225 to base station 105-*a* before transmitting second message 220 to base station 105-*a*.

In some examples, as shown in FIG. 2, UE 115-*b* may transmit transmission scheme message 225 to base station 105-*a* via direct link 205-*b*. In some cases, transmission scheme message 225 may be transmitted to base station 105-*a* using FR2. In other examples, transmission scheme message 225 may be transmitted to base station 105-*a* via a FR2 channel established between UE 115-*b* and base station 105-*a*, via a frequency range 1 (FR1) channel established between UE 115-*b* and base station 105-*a*, or a control channel between UE 115-*b* and base station 105-*a*.

In some cases, base station 105-*a* may determine, based on the received transmission scheme message 225, a relative weighting (e.g., an LLR weighting) for decoding the first message 215. For example, the base station 105-*a* may determine a weighting for the portion of first message 215 on which UE 115-*b* performed the DF transmission scheme, which may be different than a weighting of the portion of first message 215 on which UE 115-*b* performed the AF transmission scheme. In some examples, performance of the AF transmission scheme by UE 115-*b* on some or all of first message 215 may indicate to base station 105-*a* that the corresponding some or all of first message 215 included within second message 220 may include relatively less reliable data, as compared to data resulting from performance of the DF transmission scheme. In some cases, performance of the DF transmission scheme by UE 115-*b* on some or all of first message 215 may indicate to base station 105-*a* that the corresponding some or all of first message 215 included within second message 220 may include relatively more reliable data, as compared to performance of the AF transmission scheme on the some or all of first message 215.

In some examples, UE 115-*b* may transmit the portions of first message 215 that have been processed using the DF transmission scheme using a relatively wider transmission beam and a relatively fewer number of antennas, as compared to a transmission of data using the AF transmission scheme. In such examples, the relatively lesser number of antennas and the relatively wider transmission beam may be used because data resulting from performance of the DF transmission scheme may be transmitted using a relatively smaller link budget, as compared to data resulting from performance of the AF transmission scheme. Additionally, in some examples, a relatively narrower beam and a relatively greater number of antennas may be used to transmit second message 220 from UE 115-*b* to base station 105-*a* in instances where the AF transmission scheme was used by UE 115-*a* to transmit first message 215 to UE 115-*b*. In such examples, the relatively greater number of antennas and the relatively narrower beam may be used because a relatively higher link budget, as compared to the link budget which may be used to transmit data resulting from performance of the DF transmission scheme, may be used to transmit the data transmitted to UE 115-*b* from UE 115-*a* using the AF transmission scheme.

In some cases, the base station 105-*a* may receive the second message 220 from UE 115-*b* via direct link 205-*b* and may also receive the first message 215 from UE 115-*a* via direct link 205-*a*. In such cases, the base station 105-*a* may perform a joint decoding procedure using the first message 215 received via direct link 205-*a* and the second message 220 received via direct link 205-*b*. The joint decoding procedure may utilize decoding weights, which may be determined based on whether AF or DF was used for the second message 220. For instance, if DF was used for the second message 220, the base station 105-*a* may give higher decoding weights to the second message 220, or portions of the second message in which DF was used, as compared to if AF was used for the second message 220 (or the portions of the second message 220 on which AF was performed).

Figure 3:
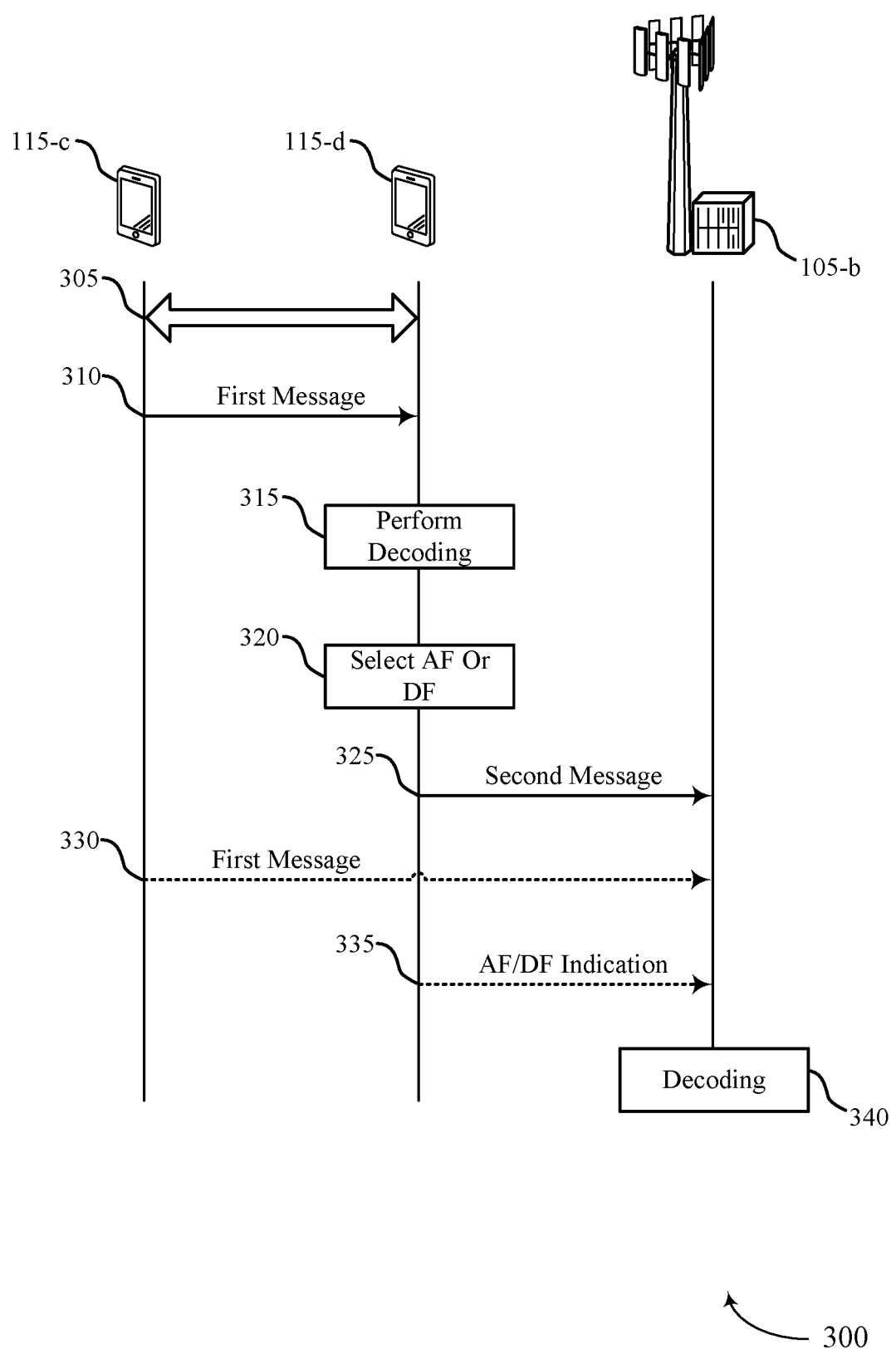
FIG. 3 illustrates an example of a process flow that supports combining techniques for message forwarding in wireless communications in accordance with aspects of the present disclosure.

FIG. 3 illustrates an example of a process flow 300 that supports combining techniques for message forwarding in wireless communications in accordance with aspects of the present disclosure. In some examples, process flow 300 may implement aspects of wireless communications systems 100 or 200.

Process flow 300 may be implemented by a base station 105-*b*, a sending UE 115-*c*, and a relay or receiving UE 115-*d*.

At 305, a sidelink communication link may be established between sending UE 115-*c* and receiving UE 115-*d*. Although not shown, receiving UE 115-*d* may establish sidelink communications links with multiple UEs 115 and may act as a relay for each of the multiple UEs 115.

At 310, UE 115-*c* may transmit a first message to UE 115-*d*. UE 115-*d* may receive the first message via the sidelink communication link established at 305. The first message may be transmitted and received according to configured beamforming parameters. For example, UE 115-*c* may utilize transmission beam parameters for transmitting the first message and UE 115-*d* may utilize reception beam parameters for receiving the first message.

At 315, UE 115-*d* may perform decoding on the first message received at 310. For example, the UE 115-*d* may attempt to decode the first message and if successful, may select a DF transmission scheme at 320. If the decoding at 315 is unsuccessful, the UE 115-*d* may select an AF transmission scheme at 320. In some cases, a portion of the first message may be successfully decoded, and a different portion of the first message may not be successfully decoded. In such instances, the UE 115-*d* may select AF for the portion that failed decoding, and may select DF for the portion having a successful decoding.

Decoding at 315 may be performed and may include a CRC on the first message. If the CRC passes, the UE 115-*d* may select a DF transmission scheme at 320. If the CRC fails, the UE 115-*d* may select an AF transmission scheme at 320. Additionally or alternatively, if the decoding at 315 is unsuccessful, the UE 115-*d* may optionally perform a correction procedure to correct I/Q issues of the received first message. The correction procedure may be based on an I/Q imbalance based on channel conditions between the UE 115-*c* and the UE 115-*d*, the capabilities of UE 115-*d*, or the capabilities of UE 115-*c*.

At 320, UE 115-*d* may select one or both of AF and DF transmission schemes based on the decoding performed at 315.

At 325, UE 115-*d* may generate and transmit a second message to base station 105-*b*, which may include portions of the first message or at least some information of the first message. If decoding was successful at 315, the UE 115-*d* may perform encoding prior to transmitting the second message at 325. In some examples, the second message may include undecoded samples of the first message, which may be amplified if decoding was unsuccessful for the samples, for instance.

At 330, UE 115-*c* may optionally transmit the first message, or information of the first message, to base station 105-*b*.

At 335, UE 115-*d* may optionally transmit an AF/DF indication, which may indicate to the base station 105-*b* whether AF or DF was selected. In some examples, the AF/DF indication may include the portions of the second message associated with AF and portions of the second message associated with DF.

At 340, the base station 105-*b* may perform decoding on the second message received at 325, and optionally, may perform a joint decoding procedure if a first message was received from UE 115-*c* at 330. The base station 105-*b* may determine decoding weights for decoding based on whether AF or DF was used for the second message. The weights may be determined based on channel conditions between the UE 115-*c* and the base station 105-*b* or the channel conditions between the UE 115-*d* and the base station 105-*b*.

Figure 4:
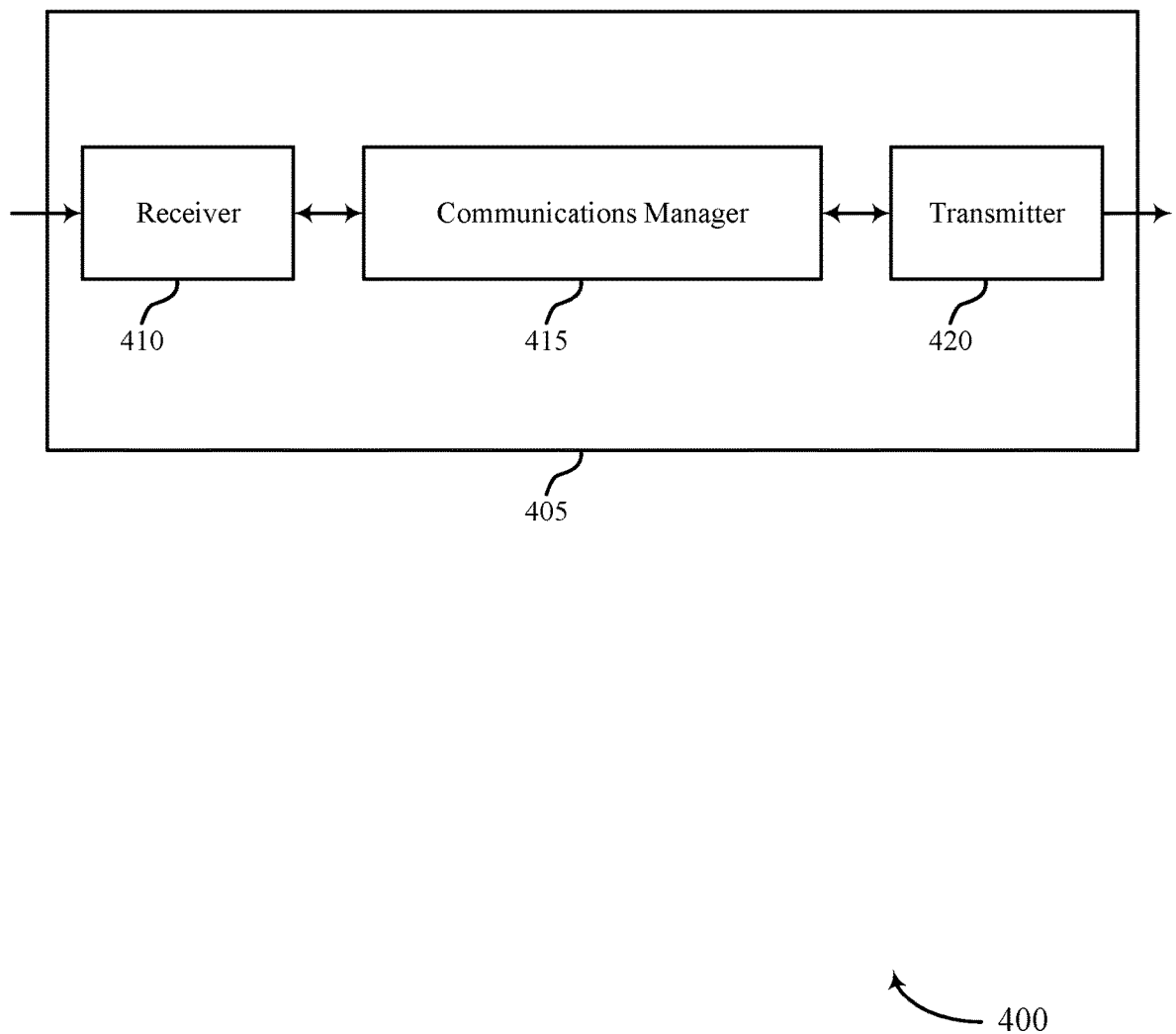
FIGS. 4 and 5 show block diagrams of devices that support combining techniques for message forwarding in wireless communications in accordance with aspects of the present disclosure.

FIG. 4 shows a block diagram 400 of a device 405 that supports combining techniques for message forwarding in wireless communications in accordance with aspects of the present disclosure. The device 405 may be an example of aspects of a UE 115 as described herein. The device 405 may include a receiver 410, a communications manager 415, and a transmitter 420. The device 405 may also include a processor. Each of these components may be in communication with one another (e.g., via one or more buses).

The receiver 410 may receive information such as packets, user data, or control information associated with various information channels (e.g., control channels, data channels, and information related to combining techniques for message forwarding in wireless communications, etc.). Information may be passed on to other components of the device 405. The receiver 410 may be an example of aspects of the transceiver 720 described with reference to FIG. 7. The receiver 410 may utilize a single antenna or a set of antennas.

The communications manager 415 may receive, via a sidelink communications link, a first message from a second UE for forwarding by the first UE to a base station, perform a decoding procedure on the first message, select, based on a result of the decoding procedure, between generating a second message including a re-encoded portion of the first message for forwarding to the base station or generating the second message including an amplified portion of the first message for forwarding to the base station, and transmit the second message to the base station based on the selecting. The communications manager 415 may be an example of aspects of the communications manager 710 described herein.

The communications manager 415, or its sub-components, may be implemented in hardware, code (e.g., software or firmware) executed by a processor, or any combination thereof. If implemented in code executed by a processor, the functions of the communications manager 415, or its sub-components may be executed by a general-purpose processor, a digital signal processor (DSP), an application-specific integrated circuit (ASIC), a field programmable gate array (FPGA) or other programmable logic device, discrete gate or transistor logic, discrete hardware components, or any combination thereof designed to perform the functions described in the present disclosure.

The communications manager 415, or its sub-components, may be physically located at various positions, including being distributed such that portions of functions are implemented at different physical locations by one or more physical components. In some examples, the communications manager 415, or its sub-components, may be a separate and distinct component in accordance with various aspects of the present disclosure. In some examples, the communications manager 415, or its sub-components, may be combined with one or more other hardware components, including but not limited to an input/output (I/O) component, a transceiver, a network server, another computing device, one or more other components described in the present disclosure, or a combination thereof in accordance with various aspects of the present disclosure.

The transmitter 420 may transmit signals generated by other components of the device 405. In some examples, the transmitter 420 may be collocated with a receiver 410 in a transceiver module. For example, the transmitter 420 may be an example of aspects of the transceiver 720 described with reference to FIG. 7. The transmitter 420 may utilize a single antenna or a set of antennas.

The actions performed by the communications manager 415 as described herein may be implemented to realize one or more potential advantages. One implementation may enable a UE, such as a relay UE, to select between AF and DF transmission schemes prior to forwarding a message from another UE to a base station. This selection may be based on the success or failure of a decoding procedure performed on the message to be forwarded to the base station. Such techniques may improve the likelihood of a successful decoding of the forwarded message at the base station, which may result in higher throughput and more efficient communications (e.g., less communication errors), among other advantages.

Based on implementing the techniques as described herein, a processor of a UE (e.g., a processor controlling the receiver 410, the communications manager 415, the transmitter 420, or a combination thereof) may increase the likelihood of successful forwarding from a UE to a base station. For example, the techniques described herein may leverage performance advantages for each of AF or DF depending on UE capabilities, channel conditions, and decoding success, which may result in reduced signaling overhead and power savings, among other benefits.

In some examples, the communications manager 415 may be implemented as an integrated circuit or chipset for a mobile device modem, and the receiver 410 and transmitter 420 may be implemented as analog components (e.g., amplifiers, filters, antennas) coupled with the mobile device modem to enable wireless transmission and reception over one or more bands.

Figure 5:
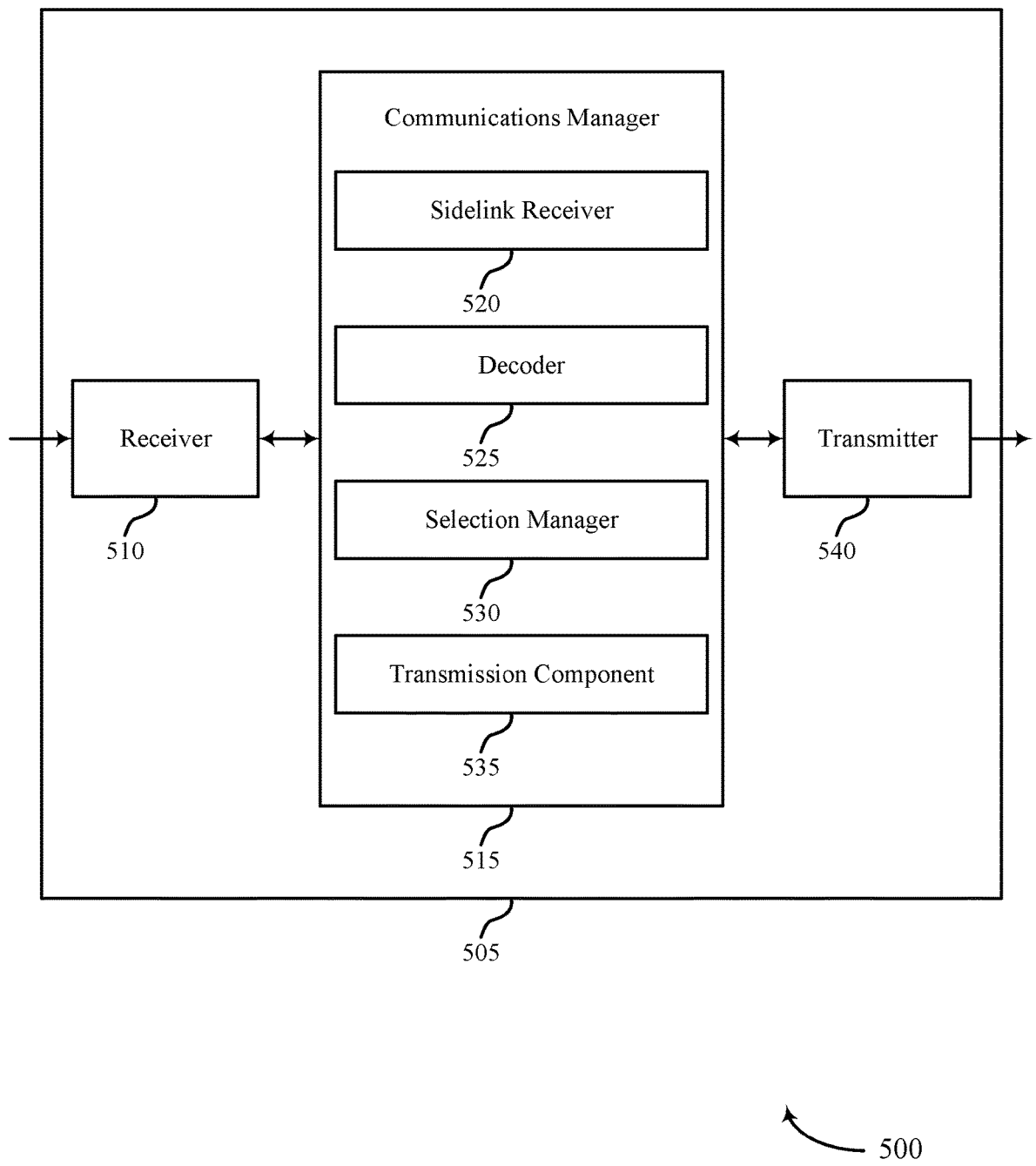

FIG. 5 shows a block diagram 500 of a device 505 that supports combining techniques for message forwarding in wireless communications in accordance with aspects of the present disclosure. The device 505 may be an example of aspects of a device 405, or a UE 115 as described herein. The device 505 may include a receiver 510, a communications manager 515, and a transmitter 540. The device 505 may also include a processor. Each of these components may be in communication with one another (e.g., via one or more buses).

The receiver 510 may receive information such as packets, user data, or control information associated with various information channels (e.g., control channels, data channels, and information related to combining techniques for message forwarding in wireless communications, etc.). Information may be passed on to other components of the device 505. The receiver 510 may be an example of aspects of the transceiver 720 described with reference to FIG. 7. The receiver 510 may utilize a single antenna or a set of antennas.

The communications manager 515 may be an example of aspects of the communications manager 415 as described herein. The communications manager 515 may include a sidelink receiver 520, a decoder 525, a selection manager 530, and a transmission component 535. The communications manager 515 may be an example of aspects of the communications manager 710 described herein.

The sidelink receiver 520 may receive, via a sidelink communications link, a first message from a second UE for forwarding by the first UE to a base station.

The decoder 525 may perform a decoding procedure on the first message.

The selection manager 530 may select, based on a result of the decoding procedure, between generating a second message including a re-encoded portion of the first message for forwarding to the base station or generating the second message including an amplified portion of the first message for forwarding to the base station.

The transmission component 535 may transmit the second message to the base station based on the selecting.

The transmitter 540 may transmit signals generated by other components of the device 505. In some examples, the transmitter 540 may be collocated with a receiver 510 in a transceiver module. For example, the transmitter 540 may be an example of aspects of the transceiver 720 described with reference to FIG. 7. The transmitter 540 may utilize a single antenna or a set of antennas.

Figure 6:
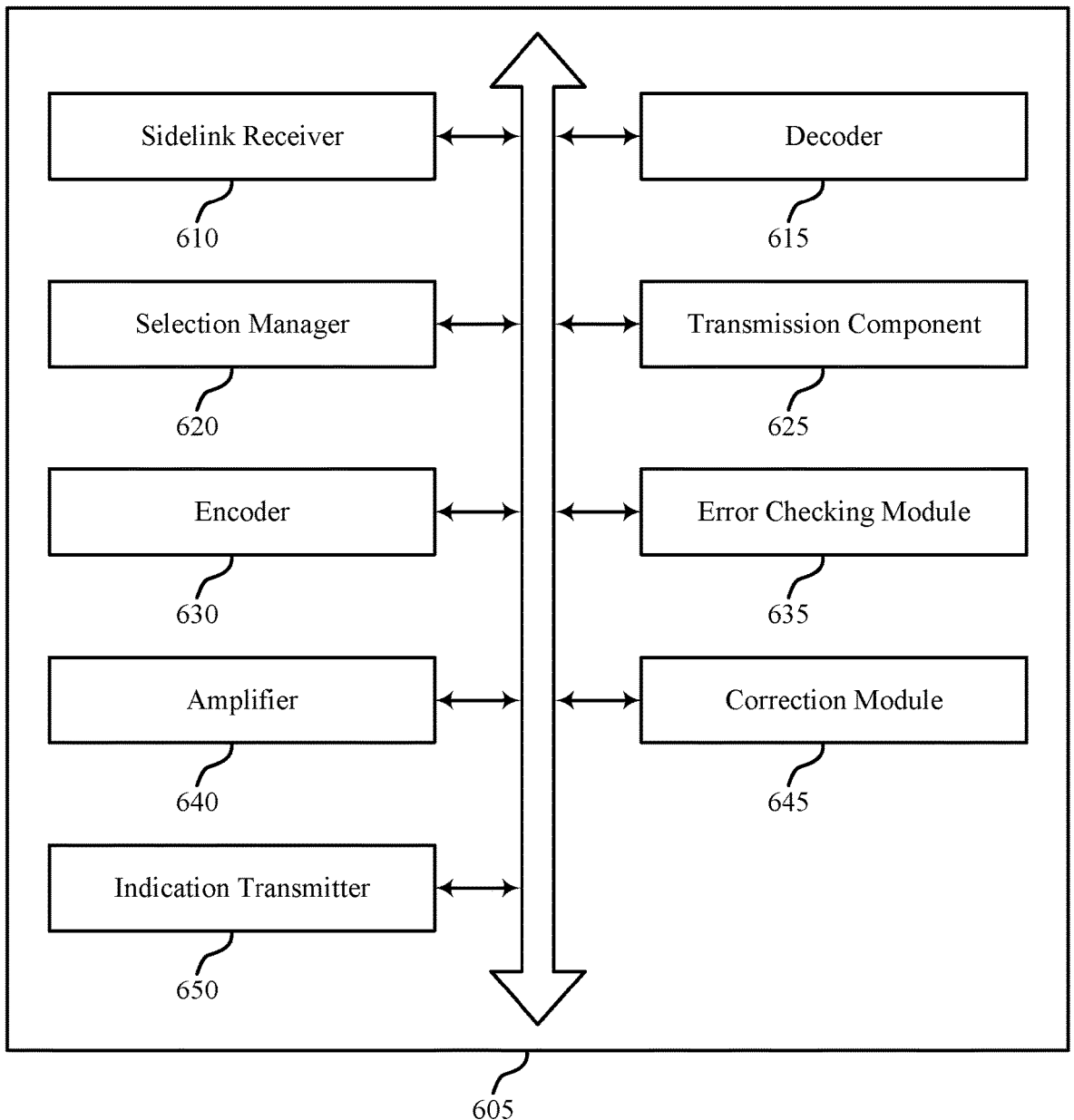
FIG. 6 shows a block diagram of a communications manager that supports combining techniques for message forwarding in wireless communications in accordance with aspects of the present disclosure.

FIG. 6 shows a block diagram 600 of a communications manager 605 that supports combining techniques for message forwarding in wireless communications in accordance with aspects of the present disclosure. The communications manager 605 may be an example of aspects of a communications manager 415, a communications manager 515, or a communications manager 710 described herein. The communications manager 605 may include a sidelink receiver 610, a decoder 615, a selection manager 620, a transmission component 625, an encoder 630, an error checking module 635, an amplifier 640, a correction module 645, and an indication transmitter 650. Each of these modules may communicate, directly or indirectly, with one another (e.g., via one or more buses).

The sidelink receiver 610 may receive, via a sidelink communications link, a first message from a second UE for forwarding by the first UE to a base station.

In some examples, the sidelink receiver 610 may receive the first message via a FR2 spectrum band, a sub-6 GHz spectrum band, a control channel, or any combination thereof.

The decoder 615 may perform a decoding procedure on the first message.

In some examples, the decoder 615 may determine the result of the decoding procedure based on a success or failure of the error checking procedure.

The selection manager 620 may select, based on a result of the decoding procedure, between generating a second message including a re-encoded portion of the first message for forwarding to the base station or generating the second message including an amplified portion of the first message for forwarding to the base station.

The transmission component 625 may transmit the second message to the base station based on the selecting.

In some examples, the transmission component 625 may transmit the second message using a wider beam or a reduced number of antennas relative to a beam used for communication of the first message based on an unsuccessful decoding procedure.

In some examples, the transmission component 625 may transmit the second message using a narrower beam or an increased number of antennas relative to a beam used for communication of the first message based on a successful decoding procedure.

The encoder 630 may encode, based on a successful decoding procedure, a decoded portion of the first message before generating the second message.

The error checking module 635 may perform, as part of the decoding procedure, an error checking procedure on the first message.

In some cases, the error checking procedure includes a CRC procedure.

The amplifier 640 may amplify, based on an unsuccessful decoding procedure, an undecoded portion of the first message before generating the second message.

In some cases, the second message includes a set of undecoded samples of the first message based on the unsuccessful decoding procedure.

The correction module 645 may perform, based on an unsuccessful decoding procedure, a correction procedure for one or more I or Q samples of the first message based on channel conditions associated with the sidelink communications link, one or more capabilities of the first UE, one or more capabilities of the second UE, or any combination thereof.

In some cases, the correction procedure may be for an I/Q imbalance based on the channel conditions associated with the sidelink communications link, the one or more capabilities of the first UE, the one or more capabilities of the second UE, or any combination thereof.

The indication transmitter 650 may transmit, to the base station, an indication of a transmission scheme used for transmitting the second message based on the selecting, where the transmission scheme includes an amplify and forward transmission scheme based on an unsuccessful decoding procedure or a decode and forward transmission scheme based on a successful decoding procedure.

In some cases, the indication conveys a corresponding reliability for the transmission scheme, where the amplify and forward transmission scheme may be associated with a lower reliability than the decode and forward transmission scheme.

In some cases, the indication may be transmitted via a control channel.

Figure 7:
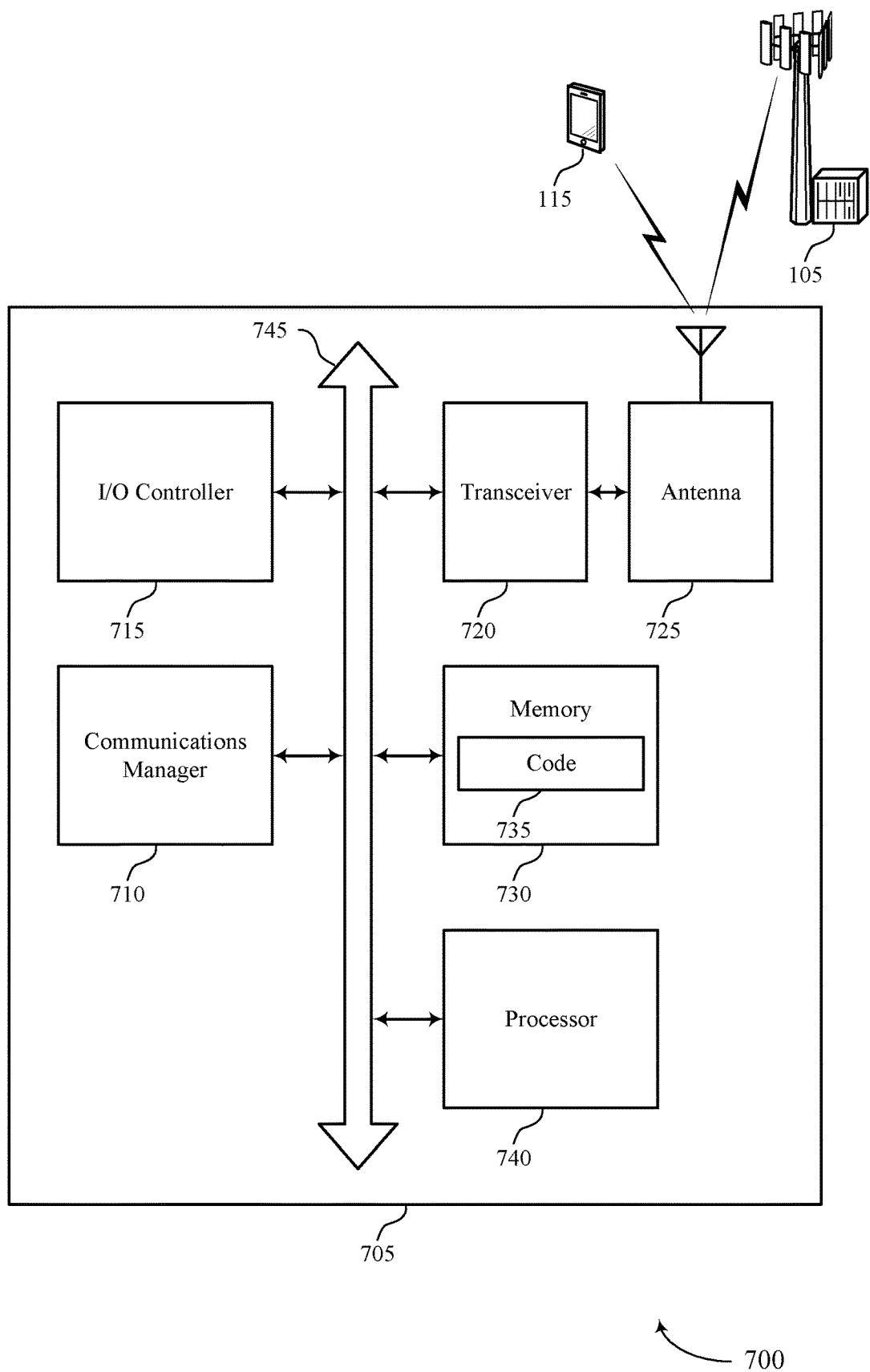
FIG. 7 shows a diagram of a system including a device that supports combining techniques for message forwarding in wireless communications in accordance with aspects of the present disclosure.

FIG. 7 shows a diagram of a system 700 including a device 705 that supports combining techniques for message forwarding in wireless communications in accordance with aspects of the present disclosure. The device 705 may be an example of or include the components of device 405, device 505, or a UE 115 as described herein. The device 705 may include components for bi-directional voice and data communications including components for transmitting and receiving communications, including a communications manager 710, an I/O controller 715, a transceiver 720, an antenna 725, memory 730, and a processor 740. These components may be in electronic communication via one or more buses (e.g., bus 745).

The communications manager 710 may receive, via a sidelink communications link, a first message from a second UE for forwarding by the first UE to a base station, perform a decoding procedure on the first message, select, based on a result of the decoding procedure, between generating a second message including a re-encoded portion of the first message for forwarding to the base station or generating the second message including an amplified portion of the first message for forwarding to the base station, and transmit the second message to the base station based on the selecting.

The I/O controller 715 may manage input and output signals for the device 705. The I/O controller 715 may also manage peripherals not integrated into the device 705. In some cases, the I/O controller 715 may represent a physical connection or port to an external peripheral. In some cases, the I/O controller 715 may utilize an operating system such as iOS®, ANDROID®, MS-DOS®, MS-WINDOWS®, OS/2®, UNIX®, LINUX®, or another known operating system. In other cases, the I/O controller 715 may represent or interact with a modem, a keyboard, a mouse, a touchscreen, or a similar device. In some cases, the I/O controller 715 may be implemented as part of a processor. In some cases, a user may interact with the device 705 via the I/O controller 715 or via hardware components controlled by the I/O controller 715.

The transceiver 720 may communicate bi-directionally, via one or more antennas, wired, or wireless links as described herein. For example, the transceiver 720 may represent a wireless transceiver and may communicate bi-directionally with another wireless transceiver. The transceiver 720 may also include a modem to modulate the packets and provide the modulated packets to the antennas for transmission, and to demodulate packets received from the antennas.

In some cases, the wireless device may include a single antenna 725. However, in some cases the device may have more than one antenna 725, which may be capable of concurrently transmitting or receiving multiple wireless transmissions.

The memory 730 may include random-access memory (RAM) and read-only memory (ROM). The memory 730 may store computer-readable, computer-executable code 735 including instructions that, when executed, cause the processor to perform various functions described herein. In some cases, the memory 730 may contain, among other things, a basic I/O system (BIOS) which may control basic hardware or software operation such as the interaction with peripheral components or devices.

The processor 740 may include an intelligent hardware device, (e.g., a general-purpose processor, a DSP, a central processing unit (CPU), a microcontroller, an ASIC, an FPGA, a programmable logic device, a discrete gate or transistor logic component, a discrete hardware component, or any combination thereof). In some cases, the processor 740 may be configured to operate a memory array using a memory controller. In other cases, a memory controller may be integrated into the processor 740. The processor 740 may be configured to execute computer-readable instructions stored in a memory (e.g., the memory 730) to cause the device 705 to perform various functions (e.g., functions or tasks supporting combining techniques for message forwarding in wireless communications).

The code 735 may include instructions to implement aspects of the present disclosure, including instructions to support wireless communications. The code 735 may be stored in a non-transitory computer-readable medium such as system memory or other type of memory. In some cases, the code 735 may not be directly executable by the processor 740 but may cause a computer (e.g., when compiled and executed) to perform functions described herein.

Figure 8:
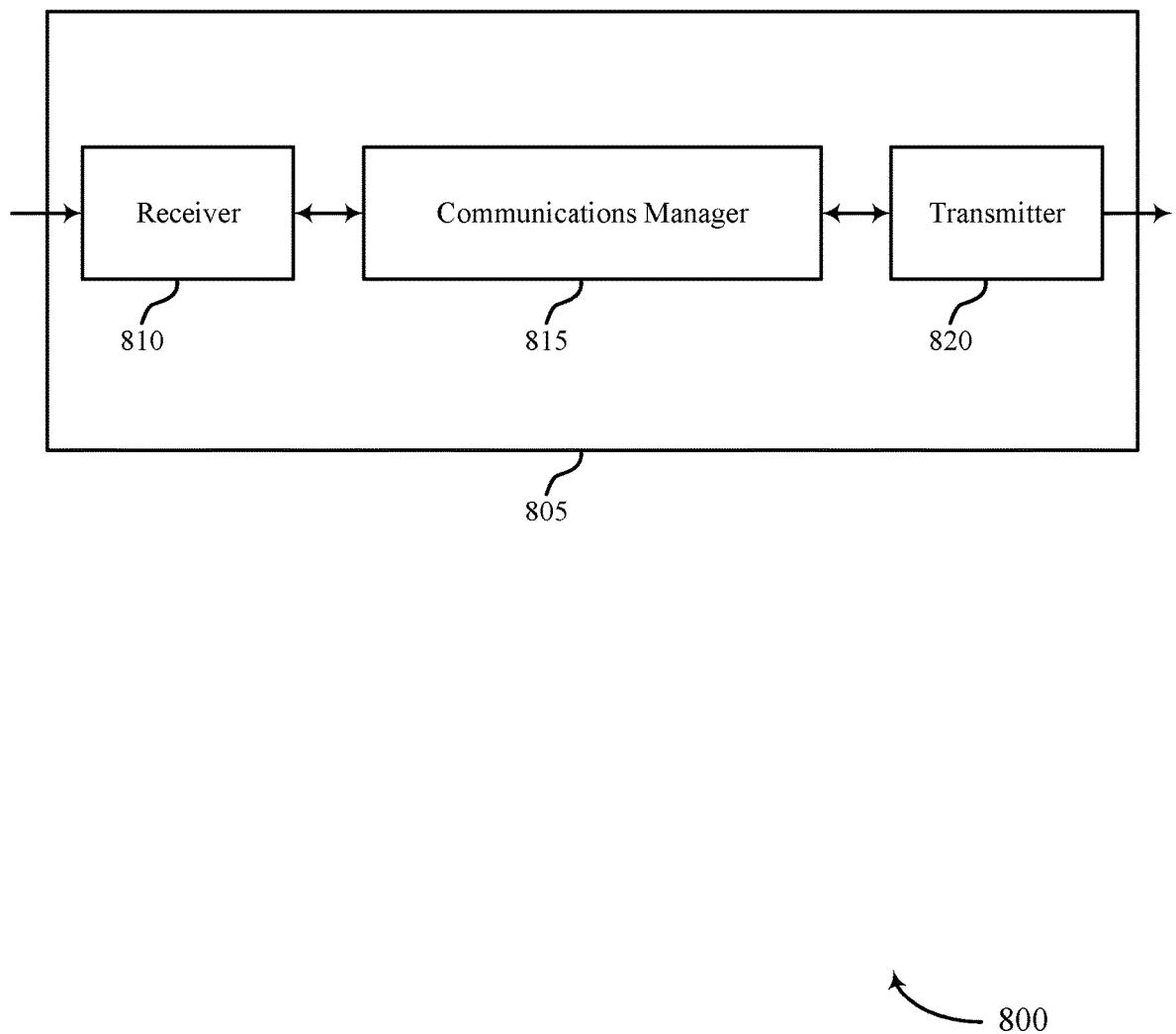
FIGS. 8 and 9 show block diagrams of devices that support combining techniques for message forwarding in wireless communications in accordance with aspects of the present disclosure.

FIG. 8 shows a block diagram 800 of a device 805 that supports combining techniques for message forwarding in wireless communications in accordance with aspects of the present disclosure. The device 805 may be an example of aspects of a base station 105 as described herein. The device 805 may include a receiver 810, a communications manager 815, and a transmitter 820. The device 805 may also include a processor. Each of these components may be in communication with one another (e.g., via one or more buses).

The receiver 810 may receive information such as packets, user data, or control information associated with various information channels (e.g., control channels, data channels, and information related to combining techniques for message forwarding in wireless communications, etc.). Information may be passed on to other components of the device 805. The receiver 810 may be an example of aspects of the transceiver 1120 described with reference to FIG. 11. The receiver 810 may utilize a single antenna or a set of antennas.

The communications manager 815 may establish a first communications link with a first UE that is in communication with a second UE via a sidelink communications link, receive a first message from the second UE via a second communications link, receive, from the first UE on the first communications link, a second message that includes a portion of the first message based on a transmission scheme used for transmission of the second message, where the transmission scheme includes one of an amplify and forward transmission scheme or a decode and forward transmission scheme, and perform a joint decoding procedure of the first message and the second message based on the transmission scheme. The communications manager 815 may be an example of aspects of the communications manager 1110 described herein.

The communications manager 815, or its sub-components, may be implemented in hardware, code (e.g., software or firmware) executed by a processor, or any combination thereof. If implemented in code executed by a processor, the functions of the communications manager 815, or its sub-components may be executed by a general-purpose processor, a DSP, an ASIC, a FPGA or other programmable logic device, discrete gate or transistor logic, discrete hardware components, or any combination thereof designed to perform the functions described in the present disclosure.

The communications manager 815, or its sub-components, may be physically located at various positions, including being distributed such that portions of functions are implemented at different physical locations by one or more physical components. In some examples, the communications manager 815, or its sub-components, may be a separate and distinct component in accordance with various aspects of the present disclosure. In some examples, the communications manager 815, or its sub-components, may be combined with one or more other hardware components, including but not limited to an I/O component, a transceiver, a network server, another computing device, one or more other components described in the present disclosure, or a combination thereof in accordance with various aspects of the present disclosure.

The transmitter 820 may transmit signals generated by other components of the device 805. In some examples, the transmitter 820 may be collocated with a receiver 810 in a transceiver module. For example, the transmitter 820 may be an example of aspects of the transceiver 1120 described with reference to FIG. 11. The transmitter 820 may utilize a single antenna or a set of antennas.

Figure 9:
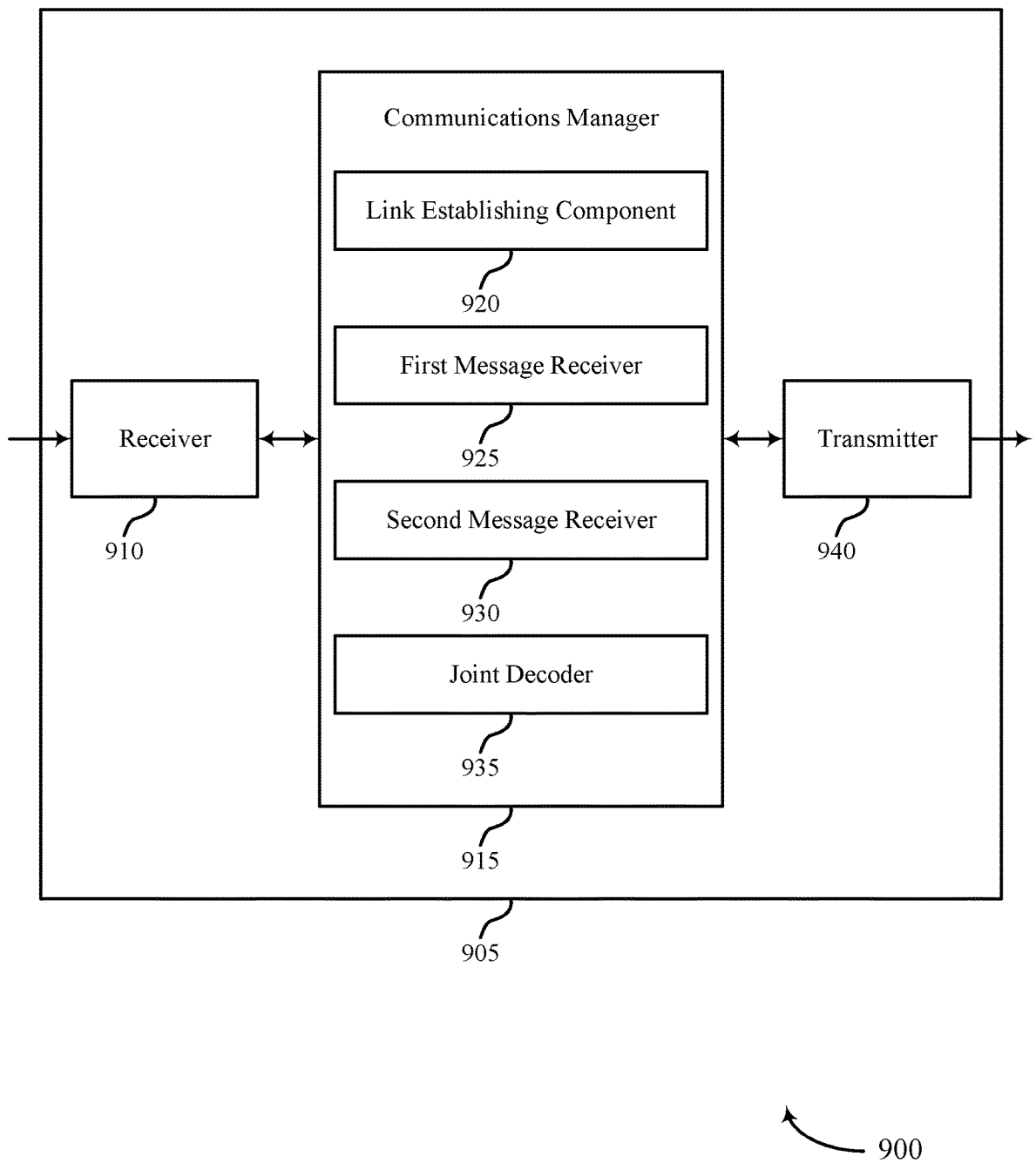

FIG. 9 shows a block diagram 900 of a device 905 that supports combining techniques for message forwarding in wireless communications in accordance with aspects of the present disclosure. The device 905 may be an example of aspects of a device 805, or a base station 105 as described herein. The device 905 may include a receiver 910, a communications manager 915, and a transmitter 940. The device 905 may also include a processor. Each of these components may be in communication with one another (e.g., via one or more buses).

The receiver 910 may receive information such as packets, user data, or control information associated with various information channels (e.g., control channels, data channels, and information related to combining techniques for message forwarding in wireless communications, etc.). Information may be passed on to other components of the device 905. The receiver 910 may be an example of aspects of the transceiver 1120 described with reference to FIG. 11. The receiver 910 may utilize a single antenna or a set of antennas.

The communications manager 915 may be an example of aspects of the communications manager 815 as described herein. The communications manager 915 may include a link establishing component 920, a first message receiver 925, a second message receiver 930, and a joint decoder 935. The communications manager 915 may be an example of aspects of the communications manager 1110 described herein.

The link establishing component 920 may establish a first communications link with a first UE that is in communication with a second UE via a sidelink communications link.

The first message receiver 925 may receive a first message from the second UE via a second communications link.

The second message receiver 930 may receive, from the first UE on the first communication link, a second message that includes a portion of the first message based on a transmission scheme used for transmission of the second message, where the transmission scheme includes one of an amplify and forward transmission scheme or a decode and forward transmission scheme.

The joint decoder 935 may perform a joint decoding procedure of the first message and the second message based on the transmission scheme.

The transmitter 940 may transmit signals generated by other components of the device 905. In some examples, the transmitter 940 may be collocated with a receiver 910 in a transceiver module. For example, the transmitter 940 may be an example of aspects of the transceiver 1120 described with reference to FIG. 11. The transmitter 940 may utilize a single antenna or a set of antennas.

Figure 10:
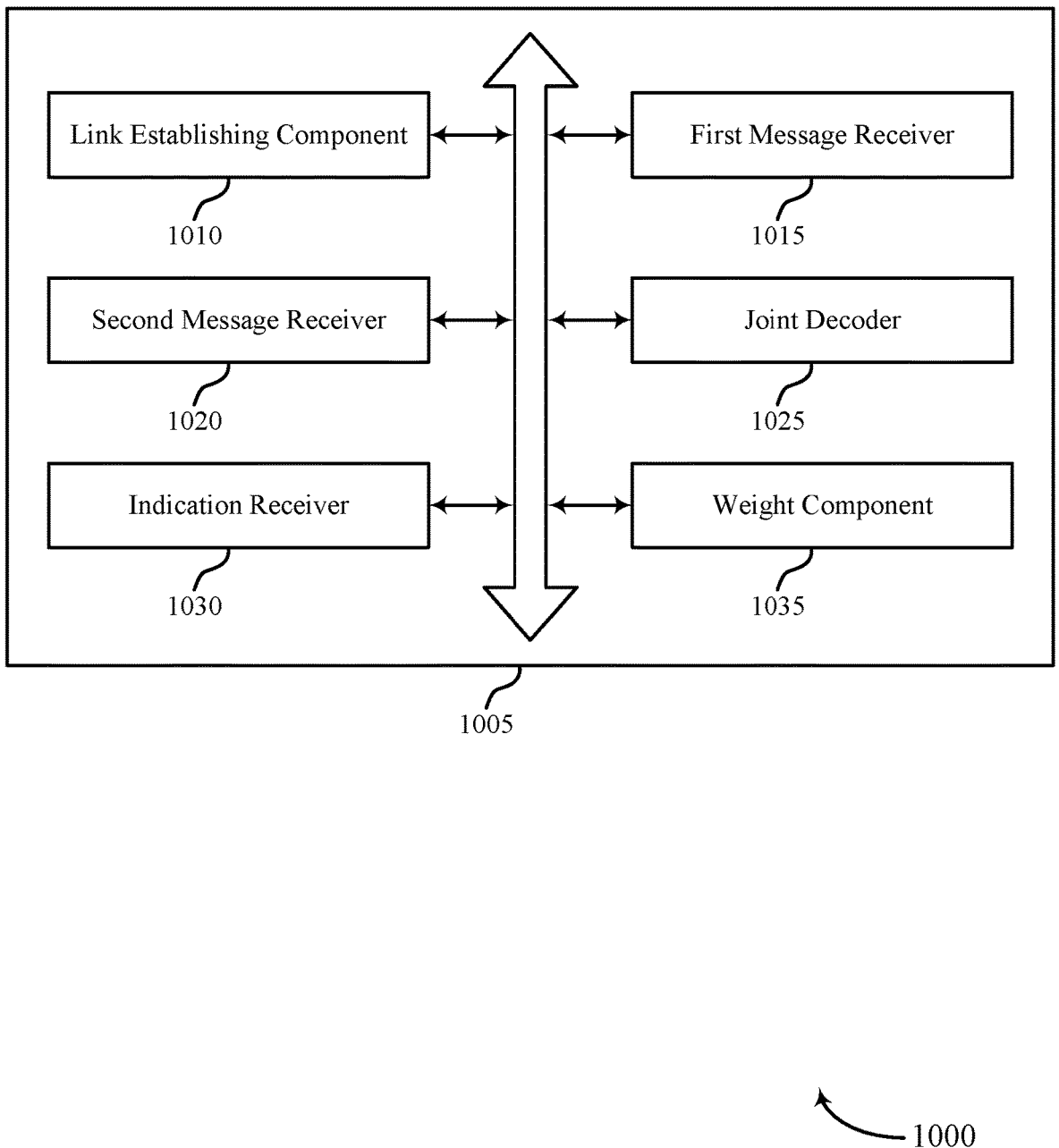
FIG. 10 shows a block diagram of a communications manager that supports combining techniques for message forwarding in wireless communications in accordance with aspects of the present disclosure.

FIG. 10 shows a block diagram 1000 of a communications manager 1005 that supports combining techniques for message forwarding in wireless communications in accordance with aspects of the present disclosure. The communications manager 1005 may be an example of aspects of a communications manager 815, a communications manager 915, or a communications manager 1110 described herein. The communications manager 1005 may include a link establishing component 1010, a first message receiver 1015, a second message receiver 1020, a joint decoder 1025, an indication receiver 1030, and a weight component 1035. Each of these modules may communicate, directly or indirectly, with one another (e.g., via one or more buses).

The link establishing component 1010 may establish a first communications link with a first UE that is in communication with a second UE via a sidelink communications link.

The first message receiver 1015 may receive a first message from the second UE via a second communications link.

The second message receiver 1020 may receive, from the first UE on the first communications link, a second message that includes a portion of the first message based on a transmission scheme used for transmission of the second message, where the transmission scheme includes one of an amplify and forward transmission scheme or a decode and forward transmission scheme.

The joint decoder 1025 may perform a joint decoding procedure of the first message and the second message based on the transmission scheme.

In some examples, the joint decoder 1025 may perform the joint decoding procedure based on the set of decoding weights.

The indication receiver 1030 may receive, from the first UE, an indication of the transmission scheme used for transmission of the second message.

In some examples, the indication receiver 1030 may receive the indication via a control channel.

In some cases, the indication may convey a corresponding reliability for the transmission scheme used for transmission of the second message, where the amplify and forward transmission scheme may be associated with a lower reliability than the decode and forward transmission scheme, and where the set of decoding weights are determined based on the corresponding reliability for the transmission scheme used for transmission of the second message.

The weight component 1035 may determine a set of decoding weights for decoding the second message based on the indication.

Figure 11:
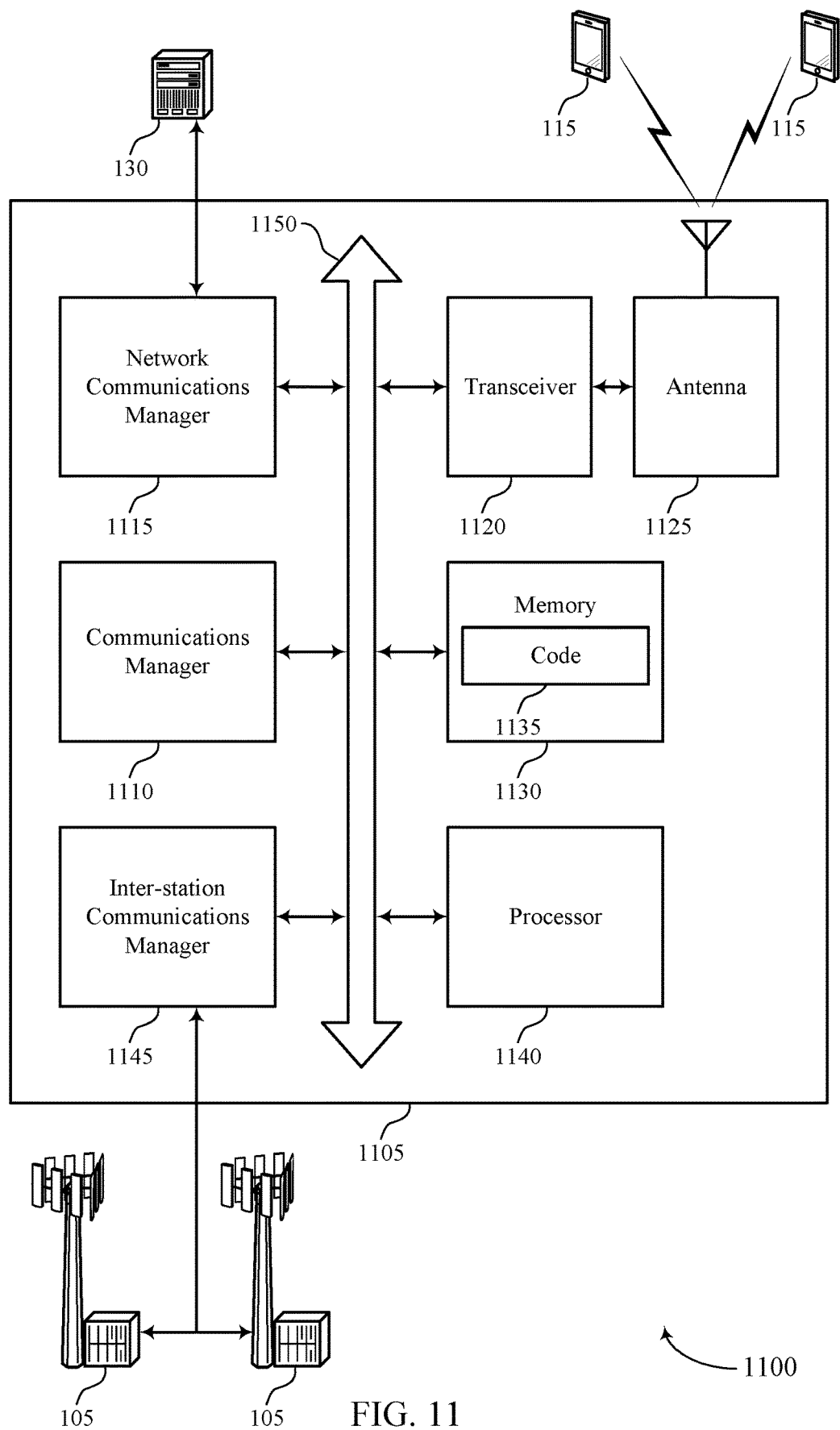
FIG. 11 shows a diagram of a system including a device that supports combining techniques for message forwarding in wireless communications in accordance with aspects of the present disclosure.

FIG. 11 shows a diagram of a system 1100 including a device 1105 that supports combining techniques for message forwarding in wireless communications in accordance with aspects of the present disclosure. The device 1105 may be an example of or include the components of device 805, device 905, or a base station 105 as described herein. The device 1105 may include components for bi-directional voice and data communications including components for transmitting and receiving communications, including a communications manager 1110, a network communications manager 1115, a transceiver 1120, an antenna 1125, memory 1130, a processor 1140, and an inter-station communications manager 1145. These components may be in electronic communication via one or more buses (e.g., bus 1150).

The communications manager 1110 may establish a first communications link with a first UE that is in communication with a second UE via a sidelink communications link, receive a first message from the second UE via a second communications link, receive, from the first UE on the first communications link, a second message that includes a portion of the first message based on a transmission scheme used for transmission of the second message, where the transmission scheme includes one of an amplify and forward transmission scheme or a decode and forward transmission scheme, and perform a joint decoding procedure of the first message and the second message based on the transmission scheme.

The network communications manager 1115 may manage communications with the core network (e.g., via one or more wired backhaul links). For example, the network communications manager 1115 may manage the transfer of data communications for client devices, such as one or more UEs 115.

The transceiver 1120 may communicate bi-directionally, via one or more antennas, wired, or wireless links as described herein. For example, the transceiver 1120 may represent a wireless transceiver and may communicate bi-directionally with another wireless transceiver. The transceiver 1120 may also include a modem to modulate the packets and provide the modulated packets to the antennas for transmission, and to demodulate packets received from the antennas.

In some cases, the wireless device may include a single antenna 1125. However, in some cases the device may have more than one antenna 1125, which may be capable of concurrently transmitting or receiving multiple wireless transmissions.

The memory 1130 may include RAM, ROM, or a combination thereof. The memory 1130 may store computer-readable code 1135 including instructions that, when executed by a processor (e.g., the processor 1140) cause the device to perform various functions described herein. In some cases, the memory 1130 may contain, among other things, a BIOS which may control basic hardware or software operation such as the interaction with peripheral components or devices.

The processor 1140 may include an intelligent hardware device, (e.g., a general-purpose processor, a DSP, a CPU, a microcontroller, an ASIC, an FPGA, a programmable logic device, a discrete gate or transistor logic component, a discrete hardware component, or any combination thereof). In some cases, the processor 1140 may be configured to operate a memory array using a memory controller. In some cases, a memory controller may be integrated into processor 1140. The processor 1140 may be configured to execute computer-readable instructions stored in a memory (e.g., the memory 1130) to cause the device 1105 to perform various functions (e.g., functions or tasks supporting combining techniques for message forwarding in wireless communications).

The inter-station communications manager 1145 may manage communications with other base station 105, and may include a controller or scheduler for controlling communications with UEs 115 in cooperation with other base stations 105. For example, the inter-station communications manager 1145 may coordinate scheduling for transmissions to UEs 115 for various interference mitigation techniques such as beamforming or joint transmission. In some examples, the inter-station communications manager 1145 may provide an X2 interface within an LTE/LTE-A wireless communication network technology to provide communication between base stations 105.

The code 1135 may include instructions to implement aspects of the present disclosure, including instructions to support wireless communications. The code 1135 may be stored in a non-transitory computer-readable medium such as system memory or other type of memory. In some cases, the code 1135 may not be directly executable by the processor 1140 but may cause a computer (e.g., when compiled and executed) to perform functions described herein.

Figure 12:
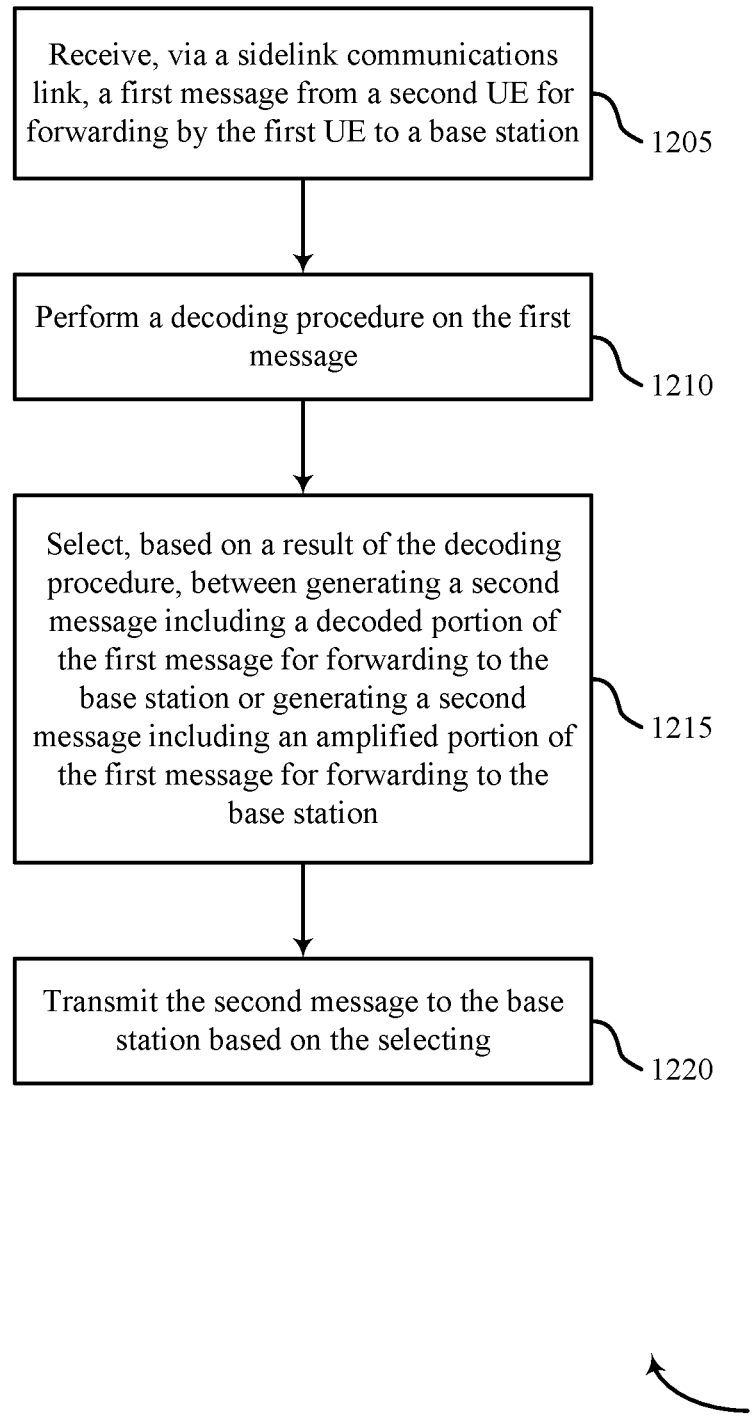
FIGS. 12 through 16 show flowcharts illustrating methods that support combining techniques for message forwarding in wireless communications in accordance with aspects of the present disclosure.

FIG. 12 shows a flowchart illustrating a method 1200 that supports combining techniques for message forwarding in wireless communications in accordance with aspects of the present disclosure. The operations of method 1200 may be implemented by a UE 115 or its components as described herein. For example, the operations of method 1200 may be performed by a communications manager as described with reference to FIGS. 4 through 7. In some examples, a UE may execute a set of instructions to control the functional elements of the UE to perform the functions described herein. Additionally or alternatively, a UE may perform aspects of the functions described herein using special-purpose hardware.

At 1205, the UE may receive, via a sidelink communications link, a first message from a second UE for forwarding by the first UE to a base station. The operations of 1205 may be performed according to the methods described herein. In some examples, aspects of the operations of 1205 may be performed by a sidelink receiver as described with reference to FIGS. 4 through 7.

At 1210, the UE may perform a decoding procedure on the first message. The operations of 1210 may be performed according to the methods described herein. In some examples, aspects of the operations of 1210 may be performed by a decoder as described with reference to FIGS. 4 through 7.

At 1215, the UE may select, based on a result of the decoding procedure, between generating a second message including a re-encoded portion of the first message for forwarding to the base station or generating the second message including an amplified portion of the first message for forwarding to the base station. The operations of 1215 may be performed according to the methods described herein. In some examples, aspects of the operations of 1215 may be performed by a selection manager as described with reference to FIGS. 4 through 7.

At 1220, the UE may transmit the second message to the base station based on the selecting. The operations of 1220 may be performed according to the methods described herein. In some examples, aspects of the operations of 1220 may be performed by a transmission component as described with reference to FIGS. 4 through 7.

Figure 13:
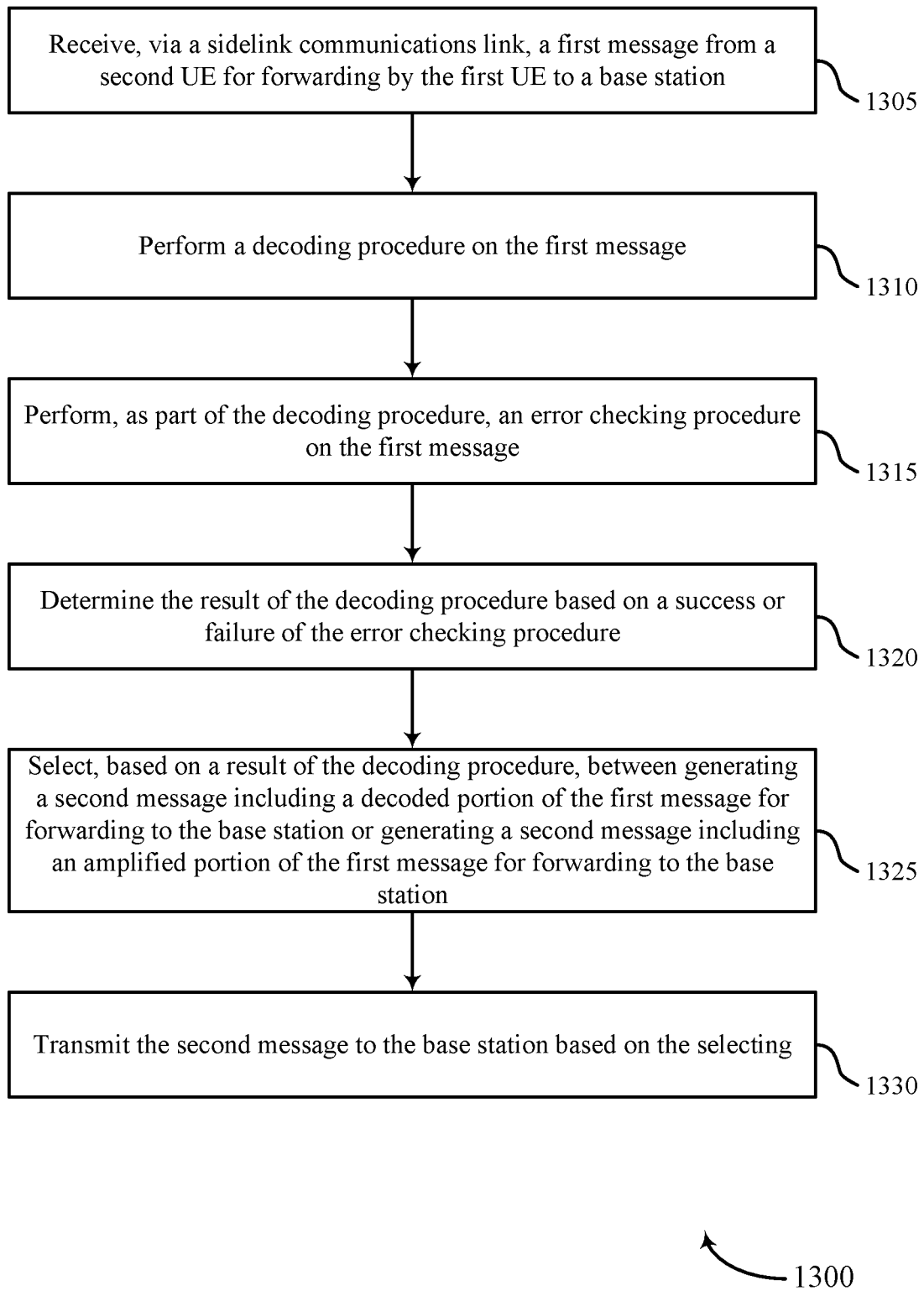

FIG. 13 shows a flowchart illustrating a method 1300 that supports combining techniques for message forwarding in wireless communications in accordance with aspects of the present disclosure. The operations of method 1300 may be implemented by a UE 115 or its components as described herein. For example, the operations of method 1300 may be performed by a communications manager as described with reference to FIGS. 4 through 7. In some examples, a UE may execute a set of instructions to control the functional elements of the UE to perform the functions described herein. Additionally or alternatively, a UE may perform aspects of the functions described herein using special-purpose hardware.

At 1305, the UE may receive, via a sidelink communications link, a first message from a second UE for forwarding by the first UE to a base station. The operations of 1305 may be performed according to the methods described herein. In some examples, aspects of the operations of 1305 may be performed by a sidelink receiver as described with reference to FIGS. 4 through 7.

At 1310, the UE may perform a decoding procedure on the first message. The operations of 1310 may be performed according to the methods described herein. In some examples, aspects of the operations of 1310 may be performed by a decoder as described with reference to FIGS. 4 through 7.

At 1315, the UE may perform, as part of the decoding procedure, an error checking procedure on the first message. The operations of 1315 may be performed according to the methods described herein. In some examples, aspects of the operations of 1315 may be performed by an error checking module as described with reference to FIGS. 4 through 7.

At 1320, the UE may determine the result of the decoding procedure based on a success or failure of the error checking procedure. The operations of 1320 may be performed according to the methods described herein. In some examples, aspects of the operations of 1320 may be performed by a decoder as described with reference to FIGS. 4 through 7.

At 1325, the UE may select, based on a result of the decoding procedure, between generating a second message including a re-encoded portion of the first message for forwarding to the base station or generating the second message including an amplified portion of the first message for forwarding to the base station. The operations of 1325 may be performed according to the methods described herein. In some examples, aspects of the operations of 1325 may be performed by a selection manager as described with reference to FIGS. 4 through 7.

At 1330, the UE may transmit the second message to the base station based on the selecting. The operations of 1330 may be performed according to the methods described herein. In some examples, aspects of the operations of 1330 may be performed by a transmission component as described with reference to FIGS. 4 through 7.

Figure 14:
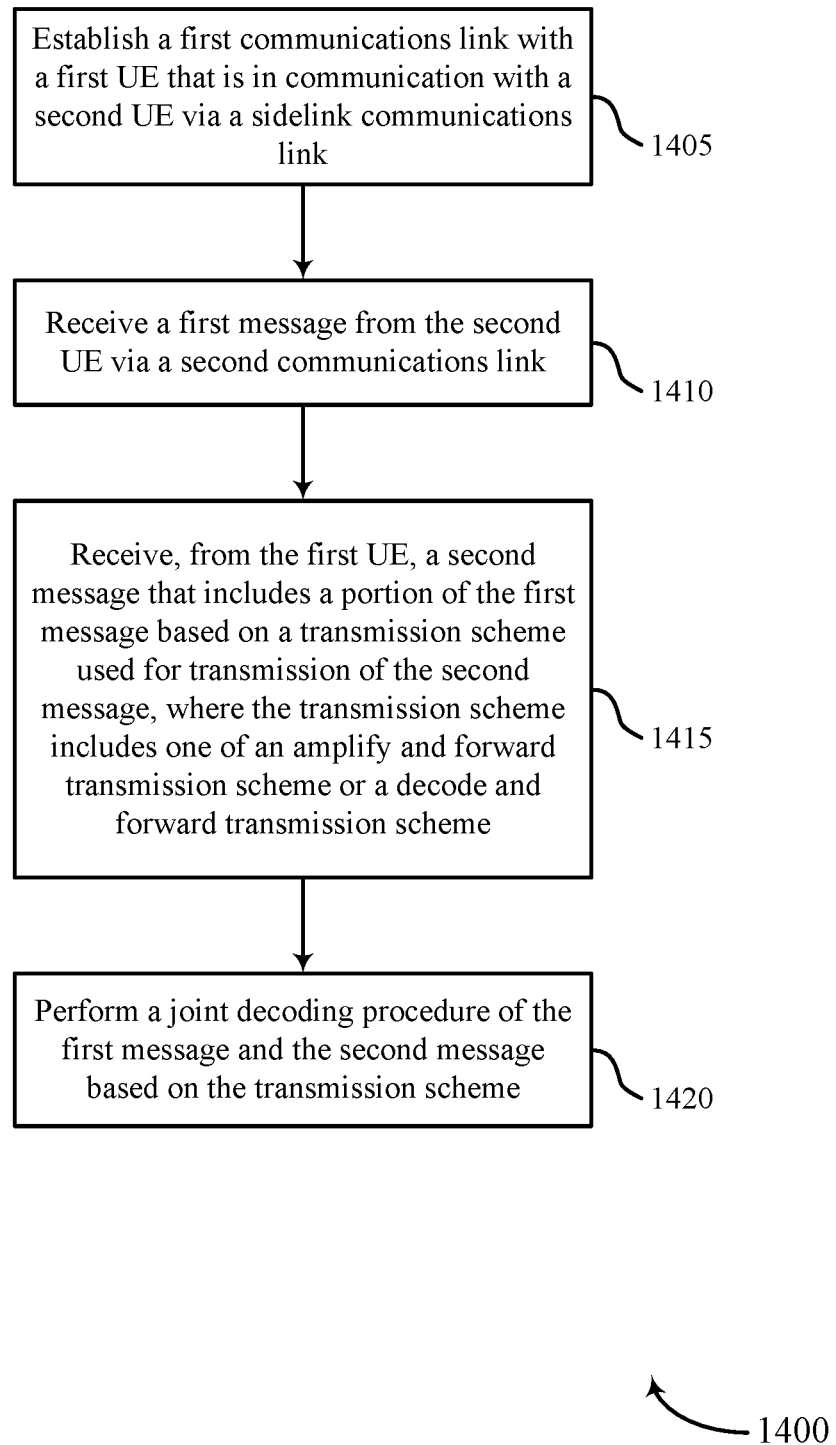

FIG. 14 shows a flowchart illustrating a method 1400 that supports combining techniques for message forwarding in wireless communications in accordance with aspects of the present disclosure. The operations of method 1400 may be implemented by a base station 105 or its components as described herein. For example, the operations of method 1400 may be performed by a communications manager as described with reference to FIGS. 8 through 11. In some examples, a base station may execute a set of instructions to control the functional elements of the base station to perform the functions described herein. Additionally or alternatively, a base station may perform aspects of the functions described herein using special-purpose hardware.

At 1405, the base station may establish a first communications link with a first UE that is in communication with a second UE via a sidelink communications link. The operations of 1405 may be performed according to the methods described herein. In some examples, aspects of the operations of 1405 may be performed by a link establishing component as described with reference to FIGS. 8 through 11.

At 1410, the base station may receive a first message from the second UE via a second communications link. The operations of 1410 may be performed according to the methods described herein. In some examples, aspects of the operations of 1410 may be performed by a first message receiver as described with reference to FIGS. 8 through 11.

At 1415, the base station may receive, from the first UE on the first communications link, a second message that includes a portion of the first message based on a transmission scheme used for transmission of the second message, where the transmission scheme includes one of an amplify and forward transmission scheme or a decode and forward transmission scheme. The operations of 1415 may be performed according to the methods described herein. In some examples, aspects of the operations of 1415 may be performed by a second message receiver as described with reference to FIGS. 8 through 11.

At 1420, the base station may perform a joint decoding procedure of the first message and the second message based on the transmission scheme. The operations of 1420 may be performed according to the methods described herein. In some examples, aspects of the operations of 1420 may be performed by a joint decoder as described with reference to FIGS. 8 through 11.

Figure 15:
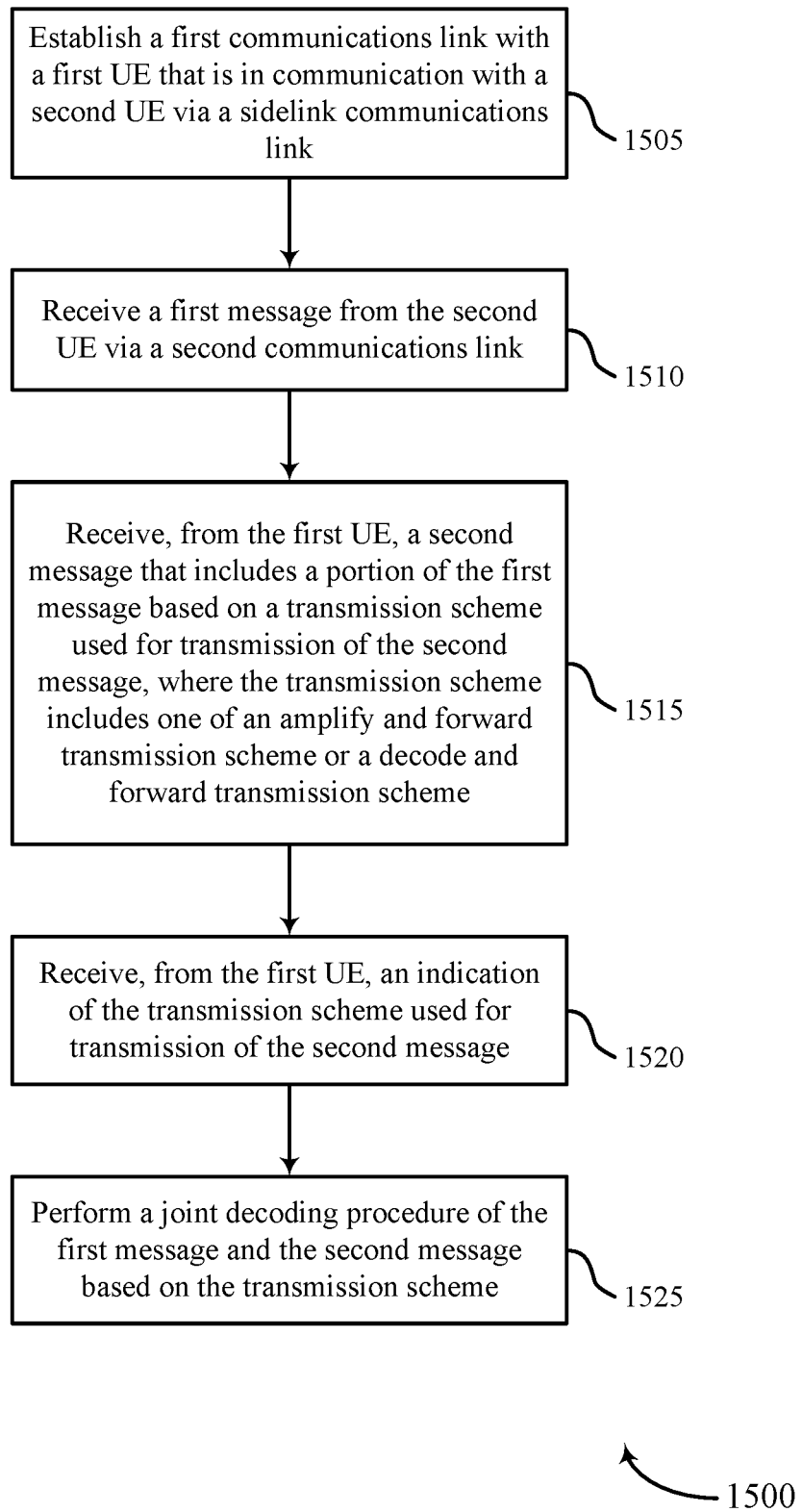

FIG. 15 shows a flowchart illustrating a method 1500 that supports combining techniques for message forwarding in wireless communications in accordance with aspects of the present disclosure. The operations of method 1500 may be implemented by a base station 105 or its components as described herein. For example, the operations of method 1500 may be performed by a communications manager as described with reference to FIGS. 8 through 11. In some examples, a base station may execute a set of instructions to control the functional elements of the base station to perform the functions described herein. Additionally or alternatively, a base station may perform aspects of the functions described herein using special-purpose hardware.

At 1505, the base station may establish a first communications link with a first UE that is in communication with a second UE via a sidelink communications link. The operations of 1505 may be performed according to the methods described herein. In some examples, aspects of the operations of 1505 may be performed by a link establishing component as described with reference to FIGS. 8 through 11.

At 1510, the base station may receive a first message from the second UE via a second communications link. The operations of 1510 may be performed according to the methods described herein. In some examples, aspects of the operations of 1510 may be performed by a first message receiver as described with reference to FIGS. 8 through 11.

At 1515, the base station may receive, from the first UE from the first communications link, a second message that includes a portion of the first message based on a transmission scheme used for transmission of the second message, where the transmission scheme includes one of an amplify and forward transmission scheme or a decode and forward transmission scheme. The operations of 1515 may be performed according to the methods described herein. In some examples, aspects of the operations of 1515 may be performed by a second message receiver as described with reference to FIGS. 8 through 11.

At 1520, the base station may receive, from the first UE, an indication of the transmission scheme used for transmission of the second message. The operations of 1520 may be performed according to the methods described herein. In some examples, aspects of the operations of 1520 may be performed by an indication receiver as described with reference to FIGS. 8 through 11.

At 1525, the base station may perform a joint decoding procedure of the first message and the second message based on the transmission scheme. The operations of 1525 may be performed according to the methods described herein. In some examples, aspects of the operations of 1525 may be performed by a joint decoder as described with reference to FIGS. 8 through 11.

Figure 16:
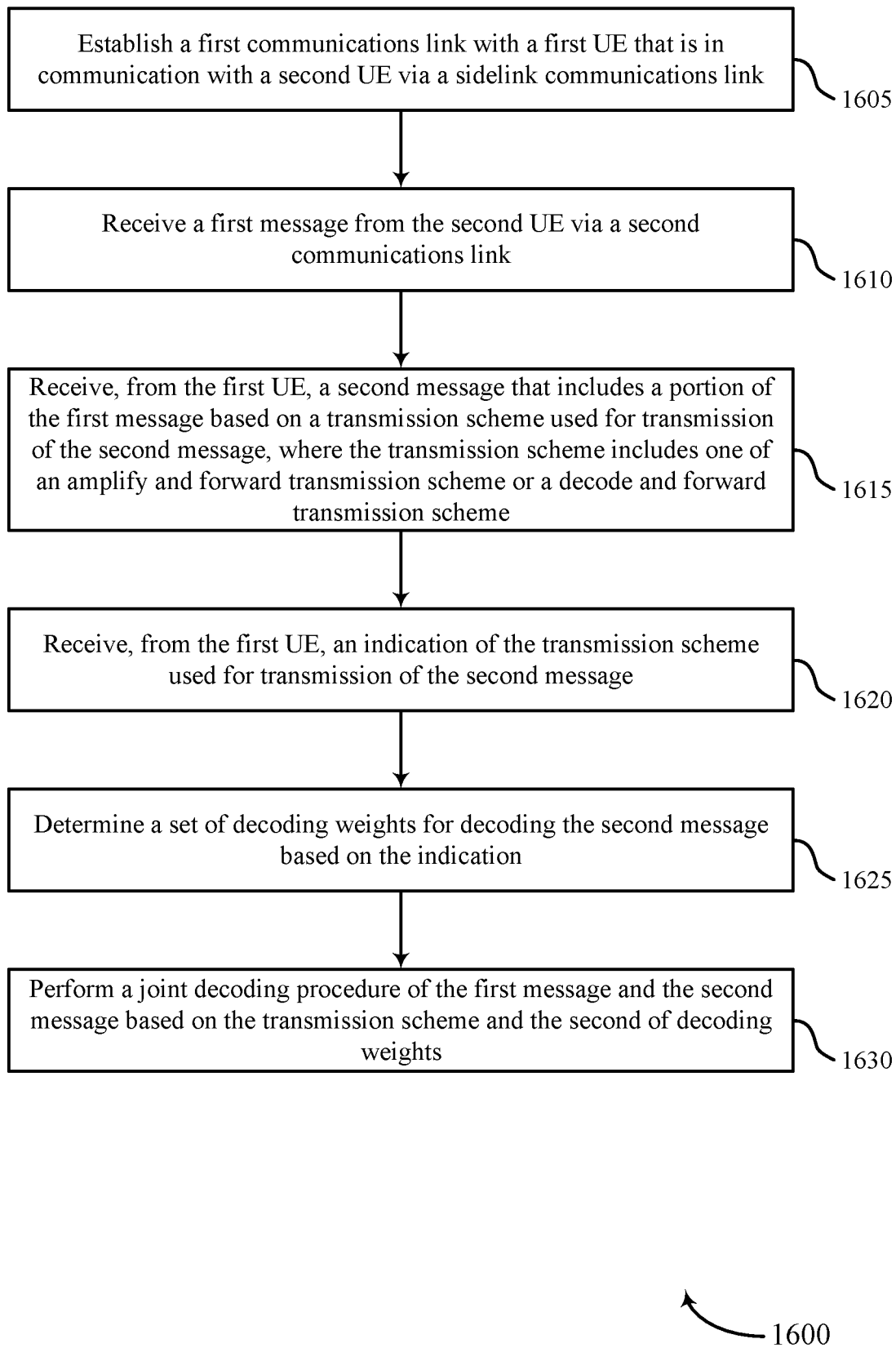

FIG. 16 shows a flowchart illustrating a method 1600 that supports combining techniques for message forwarding in wireless communications in accordance with aspects of the present disclosure. The operations of method 1600 may be implemented by a base station 105 or its components as described herein. For example, the operations of method 1600 may be performed by a communications manager as described with reference to FIGS. 8 through 11. In some examples, a base station may execute a set of instructions to control the functional elements of the base station to perform the functions described herein. Additionally or alternatively, a base station may perform aspects of the functions described herein using special-purpose hardware.

At 1605, the base station may establish a first communications link with a first UE that is in communication with a second UE via a sidelink communications link. The operations of 1605 may be performed according to the methods described herein. In some examples, aspects of the operations of 1605 may be performed by a link establishing component as described with reference to FIGS. 8 through 11.

At 1610, the base station may receive a first message from the second UE via a second communications link. The operations of 1610 may be performed according to the methods described herein. In some examples, aspects of the operations of 1610 may be performed by a first message receiver as described with reference to FIGS. 8 through 11.

At 1615, the base station may receive, from the first UE on the first communications link, a second message that includes a portion of the first message based on a transmission scheme used for transmission of the second message, where the transmission scheme includes one of an amplify and forward transmission scheme or a decode and forward transmission scheme. The operations of 1615 may be performed according to the methods described herein. In some examples, aspects of the operations of 1615 may be performed by a second message receiver as described with reference to FIGS. 8 through 11.

At 1620, the base station may receive, from the first UE, an indication of the transmission scheme used for transmission of the second message. The operations of 1620 may be performed according to the methods described herein. In some examples, aspects of the operations of 1620 may be performed by an indication receiver as described with reference to FIGS. 8 through 11.

At 1625, the base station may determine a set of decoding weights for decoding the second message based on the indication. The operations of 1625 may be performed according to the methods described herein. In some examples, aspects of the operations of 1625 may be performed by a weight component as described with reference to FIGS. 8 through 11.

At 1630, the base station may perform a joint decoding procedure of the first message and the second message based on the transmission scheme and the set of decoding weights. The operations of 1630 may be performed according to the methods described herein. In some examples, aspects of the operations of 1630 may be performed by a joint decoder as described with reference to FIGS. 8 through 11.

The following provides an overview of aspects of the present disclosure:

Aspect 1: A method for wireless communications at a first UE, comprising: receiving, via a sidelink communications link, a first message from a second UE for forwarding by the first UE to a base station; performing a decoding procedure on the first message; selecting, based at least in part on a result of the decoding procedure, between generating a second message comprising a re-encoded portion of the first message for forwarding to the base station or generating the second message comprising an amplified portion of the first message for forwarding to the base station; and transmitting the second message to the base station based at least in part on the selecting.

Aspect 2: The method of aspect 1, further comprising: encoding, based at least in part on a successful decoding procedure, a decoded portion of the first message before generating the second message.

Aspect 3: The method of aspects 1 through 2, further comprising: performing, as part of the decoding procedure, an error checking procedure on the first message; and determining the result of the decoding procedure based at least in part on a success or failure of the error checking procedure.

Aspect 4: The method of aspect 3, wherein the error checking procedure comprises a CRC procedure.

Aspect 5: The method of aspect 1 and aspects 3 through 4, further comprising: amplifying, based at least in part on an unsuccessful decoding procedure, an undecoded portion of the first message before generating the second message.

Aspect 6: The method of aspect 5, wherein the second message comprises a set of undecoded samples of the first message based at least in part on the unsuccessful decoding procedure.

Aspect 7: The method of aspect 1 and aspects 3 through 6, further comprising: performing, based at least in part on an unsuccessful decoding procedure, a correction procedure for one or more I/Q samples of the first message based at least in part on channel conditions associated with the sidelink communications link, one or more capabilities of the first UE, one or more capabilities of the second UE, or any combination thereof.

Aspect 8: The method of aspect 7, wherein the correction procedure is for an I/Q imbalance based at least in part on the channel conditions associated with the sidelink communications link, the one or more capabilities of the first UE, the one or more capabilities of the second UE, or any combination thereof.

Aspect 9: The method of aspects 1 through 8, further comprising: transmitting, to the base station, an indication of a transmission scheme used for transmitting the second message based at least in part on the selecting, wherein the transmission scheme comprises an amplify and forward transmission scheme based at least in part on an unsuccessful decoding procedure or a decode and forward transmission scheme based at least in part on a successful decoding procedure.

Aspect 10: The method of aspect 9, wherein the indication conveys a corresponding reliability for the transmission scheme, wherein the amplify and forward transmission scheme is associated with a lower reliability than the decode and forward transmission scheme.

Aspect 11: The method of aspects 9 through 10, wherein the indication is transmitted via a control channel.

Aspect 12: The method of aspects 1 through 11, further comprising: receiving the first message via a FR2 spectrum band, a sub 6 GHz spectrum band, a control channel, or any combination thereof.

Aspect 13: The method of aspects 1 through 12, further comprising: transmitting the second message using a wider beam or a reduced number of antennas relative to a beam used for communication of the first message based at least in part on an unsuccessful decoding procedure.

Aspect 14: The method of aspects 1 through 12, further comprising: transmitting the second message using a narrower beam or an increased number of antennas relative to a beam used for communication of the first message based at least in part on a successful decoding procedure.

Aspect 15: A method for wireless communications at a base station, comprising: establishing a first communications link with a first UE that is in communication with a second UE via a sidelink communications link; receiving a first message from the second UE via a second communications link; receiving, from the first UE on the first communications link, a second message that includes a portion of the first message based at least in part on a transmission scheme used for transmission of the second message, wherein the transmission scheme comprises one of an amplify and forward transmission scheme or a decode and forward transmission scheme; and performing a joint decoding procedure of the first message and the second message based at least in part on the transmission scheme Aspect 16: The method of aspect 15, further comprising: receiving, from the first UE, an indication of the transmission scheme used for transmission of the second message.

Aspect 17: The method of aspect 16, further comprising: determining a set of decoding weights for decoding the second message based at least in part on the indication; and performing the joint decoding procedure based at least in part on the set of decoding weights.

Aspect 18: The method of aspect 17, wherein the indication conveys a corresponding reliability for the transmission scheme used for transmission of the second message, wherein the amplify and forward transmission scheme is associated with a lower reliability than the decode and forward transmission scheme, and wherein the set of decoding weights are determined based at least in part on the corresponding reliability for the transmission scheme used for transmission of the second message.

Aspect 19: The method of aspects 16 through 17, further comprising: receiving the indication via a control channel.

Aspect 20: An apparatus for wireless communication at a UE, comprising a processor; memory coupled with the processor; and instructions stored in the memory and executable by the processor to cause the apparatus to perform a method of any of aspects 1 through 14.

Aspect 21: An apparatus for wireless communication at a UE, comprising at least one means for performing a method of any aspects 1 through 14.

Aspect 22: A non-transitory computer-readable medium storing code for wireless communication at a UE, the code comprising instructions executable by a processor to perform a method of any of aspects 1 through 14.

Aspect 20: An apparatus for wireless communication at a UE, comprising a processor; memory coupled with the processor; and instructions stored in the memory and executable by the processor to cause the apparatus to perform a method of any of aspects 15 through 19.

Aspect 21: An apparatus for wireless communication at a UE, comprising at least one means for performing a method of any aspects 15 through 19.

Aspect 22: A non-transitory computer-readable medium storing code for wireless communication at a UE, the code comprising instructions executable by a processor to perform a method of any of aspects 15 through 19.

It should be noted that the methods described herein describe possible implementations, and that the operations and the steps may be rearranged or otherwise modified and that other implementations are possible. Further, aspects from two or more of the methods may be combined.

Although aspects of an LTE, LTE-A, LTE-A Pro, or NR system may be described for purposes of example, and LTE, LTE-A, LTE-A Pro, or NR terminology may be used in much of the description, the techniques described herein are applicable beyond LTE, LTE-A, LTE-A Pro, or NR networks. For example, the described techniques may be applicable to various other wireless communications systems such as Ultra Mobile Broadband (UMB), Institute of Electrical and Electronics Engineers (IEEE) 802.11 (Wi-Fi), IEEE 802.16 (WiMAX), IEEE 802.20, Flash-OFDM, as well as other systems and radio technologies not explicitly mentioned herein.

Information and signals described herein may be represented using any of a variety of different technologies and techniques. For example, data, instructions, commands, information, signals, bits, symbols, and chips that may be referenced throughout the description may be represented by voltages, currents, electromagnetic waves, magnetic fields or particles, optical fields or particles, or any combination thereof.

The various illustrative blocks and components described in connection with the disclosure herein may be implemented or performed with a general-purpose processor, a DSP, an ASIC, a CPU, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described herein may be implemented using software executed by a processor, hardware, firmware, hardwiring, or combinations of any of these. Features implementing functions may also be physically located at various positions, including being distributed such that portions of functions are implemented at different physical locations.

Computer-readable media includes both non-transitory computer storage media and communication media including any medium that facilitates transfer of a computer program from one place to another. A non-transitory storage medium may be any available medium that may be accessed by a general-purpose or special purpose computer. By way of example, and not limitation, non-transitory computer-readable media may include RAM, ROM, electrically erasable programmable ROM (EEPROM), flash memory, compact disk (CD) ROM or other optical disk storage, magnetic disk storage or other magnetic storage devices, or any other non-transitory medium that may be used to carry or store desired program code means in the form of instructions or data structures and that may be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of computer-readable medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

As used herein, including in the claims, "or" as used in a list of items (e.g., a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an example step that is described as "based on condition A" may be based on both a condition A and a condition B without departing from the scope of the present disclosure. In other words, as used herein, the phrase "based on" shall be construed in the same manner as the phrase "based at least in part on."

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label, or other subsequent reference label.

The description set forth herein, in connection with the appended drawings, describes example configurations and does not represent all the examples that may be implemented or that are within the scope of the claims. The term "example" used herein means "serving as an example, instance, or illustration," and not "preferred" or "advantageous over other examples." The detailed description includes specific details for the purpose of providing an understanding of the described techniques. These techniques, however, may be practiced without these specific details. In some instances, known structures and devices are shown in block diagram form in order to avoid obscuring the concepts of the described examples.

The description herein is provided to enable a person having ordinary skill in the art to make or use the disclosure. Various modifications to the disclosure will be apparent to a person having ordinary skill in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. An apparatus for wireless communications at a first user equipment (UE), comprising:
   a processor;
   memory coupled with the processor; and
   instructions stored in the memory and executable by the processor to cause the apparatus to:
      receive, via a sidelink communications link, a first message from a second UE for forwarding by the first UE to a network entity;
      perform a decoding procedure on the first message;
      select, based at least in part on a result of the decoding procedure, between:
         generating a second message comprising a re-encoded portion of the first message for forwarding to the network entity,
         generating the second message comprising an amplified portion of the first message for forwarding to the network entity, or
         generating the second message comprising a re-encoded first portion of the first message and an amplified second portion of the first message for forwarding to the network entity; and
      transmit the second message to the network entity based at least in part on the selecting.

2. The apparatus of claim 1, wherein the instructions are further executable by the processor to cause the apparatus to:
   encode, based at least in part on a successful decoding procedure, a decoded portion of the first message before generating the second message.

3. The apparatus of claim 1, wherein the instructions are further executable by the processor to cause the apparatus to:
   perform, as part of the decoding procedure, an error checking procedure on the first message; and
   determine the result of the decoding procedure based at least in part on a success or failure of the error checking procedure.

4. The apparatus of claim 3, wherein the error checking procedure comprises a cyclic redundancy check (CRC) procedure.

5. The apparatus of claim 1, wherein the instructions are further executable by the processor to cause the apparatus to:
   amplify, based at least in part on an unsuccessful decoding procedure, an undecoded portion of the first message before generating the second message.

6. The apparatus of claim 5, wherein the second message comprises a set of undecoded samples of the first message based at least in part on the unsuccessful decoding procedure.

7. The apparatus of claim 1, wherein the instructions are further executable by the processor to cause the apparatus to:
   perform, based at least in part on an unsuccessful decoding procedure, a correction procedure for one or more in-phase (I) or quadrature (Q) samples of the first message based at least in part on channel conditions associated with the sidelink communications link, one or more capabilities of the first UE, one or more capabilities of the second UE, or any combination thereof.

8. The apparatus of claim 7, wherein the correction procedure is for an I/Q imbalance based at least in part on the channel conditions associated with the sidelink communications link, the one or more capabilities of the first UE, the one or more capabilities of the second UE, or any combination thereof.

9. The apparatus of claim 1, wherein the instructions are further executable by the processor to cause the apparatus to:
   transmit, to the network entity, an indication of a transmission scheme used for transmitting the second message based at least in part on the selecting, wherein the transmission scheme comprises an amplify and forward transmission scheme based at least in part on an unsuccessful decoding procedure or a decode and forward transmission scheme based at least in part on a successful decoding procedure.

10. The apparatus of claim 9, wherein the indication conveys a corresponding reliability for the transmission scheme, wherein the amplify and forward transmission scheme is associated with a lower reliability than the decode and forward transmission scheme.

11. The apparatus of claim 9, wherein the indication is transmitted via a control channel.

12. The apparatus of claim 1, wherein the instructions are further executable by the processor to cause the apparatus to:
   receive the first message via a frequency range 2 (FR2) spectrum band, a sub-6 gigahertz (GHz) spectrum band, a control channel, or any combination thereof.

13. The apparatus of claim 1, wherein the instructions are further executable by the processor to cause the apparatus to:
transmit the second message using a wider beam or a reduced number of antennas relative to a beam used for communication of the first message based at least in part on an unsuccessful decoding procedure.

14. The apparatus of claim 1, wherein the instructions are further executable by the processor to cause the apparatus to:
transmit the second message using a narrower beam or an increased number of antennas relative to a beam used for communication of the first message based at least in part on a successful decoding procedure.

15. An apparatus for wireless communications at a network entity, comprising:
a processor,
memory coupled with the processor; and
instructions stored in the memory and executable by the processor to cause the apparatus to:
establish a first communications link with a first user equipment (UE) that is in communication with a second UE via a sidelink communications link;
receive a first message from the second UE via a second communications link;
receive, from the first UE on the first communications link, a second message that includes a portion of the first message based at least in part on a transmission scheme used for transmission of the second message, wherein the transmission scheme comprises an amplify and forward transmission scheme and a decode and forward transmission scheme; and
perform a joint decoding procedure of the first message and the second message based at least in part on the transmission scheme.

16. The apparatus of claim 15, wherein the instructions are further executable by the processor to cause the apparatus to:
receive, from the first UE, an indication of the transmission scheme used for transmission of the second message.

17. The apparatus of claim 16, wherein the instructions are further executable by the processor to cause the apparatus to:
determine a set of decoding weights for decoding the second message based at least in part on the indication; and
perform the joint decoding procedure based at least in part on the set of decoding weights.

18. The apparatus of claim 17, wherein the indication conveys a corresponding reliability for the transmission scheme used for transmission of the second message, wherein the amplify and forward transmission scheme is associated with a lower reliability than the decode and forward transmission scheme, and wherein the set of decoding weights are determined based at least in part on the corresponding reliability for the transmission scheme used for transmission of the second message.

19. The apparatus of claim 16, wherein the instructions are further executable by the processor to cause the apparatus to:
receive the indication via a control channel.

20. A method for wireless communications at a first user equipment (UE), comprising:
receiving, via a sidelink communications link, a first message from a second UE for forwarding by the first UE to a network entity;
performing a decoding procedure on the first message;
selecting, based at least in part on a result of the decoding procedure, between:
generating a second message comprising a re-encoded portion of the first message for forwarding to the network entity,
generating the second message comprising an amplified portion of the first message for forwarding to the network entity, or
generating the second message comprising a re-encoded first portion of the first message and an amplified second portion of the first message for forwarding to the network entity; and
transmitting the second message to the network entity based at least in part on the selecting.

21. The method of claim 20, further comprising:
encoding, based at least in part on a successful decoding procedure, a decoded portion of the first message before generating the second message.

22. The method of claim 20, further comprising:
performing, as part of the decoding procedure, an error checking procedure on the first message; and
determining the result of the decoding procedure based at least in part on a success or failure of the error checking procedure.

23. The method of claim 22, wherein the error checking procedure comprises a cyclic redundancy check (CRC) procedure.

24. The method of claim 20, further comprising:
amplifying, based at least in part on an unsuccessful decoding procedure, an undecoded portion of the first message before generating the second message.

25. The method of claim 24, wherein the second message comprises a set of undecoded samples of the first message based at least in part on the unsuccessful decoding procedure.

26. The method of claim 20, further comprising:
performing, based at least in part on an unsuccessful decoding procedure, a correction procedure for one or more in-phase (I) or quadrature (Q) samples of the first message based at least in part on channel conditions associated with the sidelink communications link, one or more capabilities of the first UE, one or more capabilities of the second UE, or any combination thereof.

27. The method of claim 26, wherein the correction procedure is for an I/Q imbalance based at least in part on the channel conditions associated with the sidelink communications link, the one or more capabilities of the first UE, the one or more capabilities of the second UE, or any combination thereof.

28. The method of claim 20, further comprising:
transmitting, to the network entity, an indication of a transmission scheme used for transmitting the second message based at least in part on the selecting, wherein the transmission scheme comprises an amplify and forward transmission scheme based at least in part on an unsuccessful decoding procedure or a decode and forward transmission scheme based at least in part on a successful decoding procedure.

29. A method for wireless communications at a network entity, comprising:
establishing a first communications link with a first user equipment (UE) that is in communication with a second UE via a sidelink communications link;
receiving a first message from the second UE via a second communications link;

receiving, from the first UE on the first communications link, a second message that includes a portion of the first message based at least in part on a transmission scheme used for transmission of the second message, wherein the transmission scheme comprises an amplify and forward transmission scheme and a decode and forward transmission scheme; and performing a joint decoding procedure of the first message and the second message based at least in part on the transmission scheme.

30. The method of claim 29, further comprising:

receiving, from the first UE, an indication of the transmission scheme used for transmission of the second message.

\* \* \* \* \*